United States Patent
Kong et al.

(10) Patent No.: US 12,046,312 B2
(45) Date of Patent: Jul. 23, 2024

(54) eFUSE ONE-TIME PROGRAMMABLE MEMORY WITH INTER INTEGRATED CIRCUIT (I2C) COMMUNICATION AND OPERATION METHOD THEREOF

(71) Applicant: SK keyfoundry Inc., Cheongju-si (KR)

(72) Inventors: Wan-Chul Kong, Gwangju-si (KR); Woojin Han, Seongnam-si (KR); Changbum Im, Seongnam-si (KR); Keesik Ahn, Hwaseong-si (KR); Sungbum Park, Seongnam-si (KR); Ilwoo Lee, Yongin-si (KR)

(73) Assignee: SK keyfoundry Inc., Cheongju-si (KR)

( * ) Notice: Subject to any disclaimer, the term of this patent is extended or adjusted under 35 U.S.C. 154(b) by 252 days.

(21) Appl. No.: 17/584,586

(22) Filed: Jan. 26, 2022

(65) Prior Publication Data
US 2023/0059620 A1 Feb. 23, 2023

(30) Foreign Application Priority Data
Aug. 19, 2021 (KR) .......................... 10-2021-0109236

(51) Int. Cl.
*G11C 17/18* (2006.01)
*G06F 13/42* (2006.01)
*G11C 7/10* (2006.01)
*G11C 17/16* (2006.01)

(52) U.S. Cl.
CPC .......... *G11C 17/18* (2013.01); *G06F 13/4282* (2013.01); *G11C 7/1045* (2013.01); *G11C 17/16* (2013.01)

(58) Field of Classification Search
CPC .................................................... G11C 17/18

USPC ........................................................ 365/225.7
See application file for complete search history.

(56) References Cited

U.S. PATENT DOCUMENTS

| | | | |
|---|---|---|---|
| 8,913,449 B2 | 12/2014 | Chung | |
| 8,923,085 B2 | 12/2014 | Chung | |
| 9,019,791 B2 | 4/2015 | Chung | |
| 9,076,513 B2 | 7/2015 | Chung | |
| 2008/0126900 A1* | 5/2008 | Hagspiel | G06F 11/27 714/E11.169 |
| 2011/0302344 A1* | 12/2011 | Bell | G06F 13/4291 710/110 |

(Continued)

FOREIGN PATENT DOCUMENTS

KR  10-2017-0099668 A  9/2017

OTHER PUBLICATIONS

M24032-WM24C32-RM24C32-FM24C32-XM24C32-DF,32-K bit serial C bus EEPROM, Datasheet production data., ST life. augmented., Sep. 2017, 1-51.*

(Continued)

*Primary Examiner* — Muna A Techane
(74) *Attorney, Agent, or Firm* — NSIP Law

(57) ABSTRACT

An eFuse one-time programmable (OTP) memory is provided. The eFuse OTP memory supports inter integrated circuit (I2C) communication, and an operation method thereof. The eFuse OTP memory includes: an eFuse intellectual property (IP) which data writes once and data reads multiple times for a plurality of addresses; and an I2C slave which communicates with an I2C master based on a serial clock line and a serial data line, and performs the data write and the data read to and from the eFuse IP.

9 Claims, 13 Drawing Sheets

(56) References Cited

U.S. PATENT DOCUMENTS

2015/0120975 A1* 4/2015 Sengoku ............... G06F 13/40
710/110
2017/0243660 A1  8/2017 Kim et al.

OTHER PUBLICATIONS

M24C32-W M24C32-R M24C32-F M24C32-X M24C32-DF, 32-Kbit serial I$^2$C bus EEPROM, Datasheet—production data., ST life. augmented., Sep. 2017, 1-51.
Korean Office Action issued on Oct. 21, 2022, in counterpart Korean Patent Application No. 10-2021-0109236 (7 pages in Korean).

* cited by examiner eFUSE ONE-TIME PROGRAMMABLE MEMORY WITH INTER INTEGRATED CIRCUIT (I2C) COMMUNICATION AND OPERATION METHOD THEREOF

CROSS-REFERENCE TO RELATED APPLICATIONS

This application claims the benefit under 35 USC § 119(a) of Korean Patent Application No. 10-2021-0109236, filed on Aug. 19, 2021, in the Korean Intellectual Property Office, the entire disclosure of which is incorporated herein by reference for all purposes.

BACKGROUND

1. Field

The following description relates to an eFuse one-time programmable (OTP) memory which supports inter integrated circuit (I2C) communication, and an operation method thereof.

2. Description of Related Art

One-time programmable (OTP) memories allow only one program operation, and is commonly designated as a memory in which additional programming operations are not possible after one program.

Recently, the OTP memory may implement a fuse method. The fuse method may provide binary information depending on whether a fuse is blown or not. Recently, a power management Integrated Circuit (IC) (PMIC) often include a non-volatile memory that embeds setting parameters. Additionally, an electronic fuse (eFuse) OTP memory that does not utilize an additional process is widely used.

Typically, in order to implement an eFuse OTP memory (hereinafter, referred to as eFuse (Intellectual Property (IP) or eFuse), an individual who implements a custom IC understands read/write functions and timing based on the specifications of the eFuse IP, reviews how to utilize the programmed data of the eFuse IP as an internal control signal of the custom design block, implements a circuit to control the eFuse IP, and mounts the circuit on the customer implemented block. Then, only when the customer implemented block is silicon-proven is the individual able to properly use the eFuse IP.

When the individual directly implements a control circuit for the eFuse, problems may occur with regard to functional and electrical properties in an initial production IC, or in a verification IC, due to insufficient review for write/read functions or defects in a production or manufacturing operation.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, an eFuse one-time programmable (OTP) memory includes an eFuse intellectual property (IP), configured to perform one-time writing and multiple reading for a plurality of addresses; and an inter integrated circuit (I2C) slave, configured to communicate with an I2C master based on a serial clock line and a serial data line, and perform data writing and data reading to and from the eFuse IP.

The I2C slave may include an I2C slave interface, configured to communicate with the I2C master; a register block, configured to store serial data received from the I2C master through the serial data line, and store data read from the eFuse IP; an eFuse controller, configured to generate a control signal to write data to the eFuse IP or to read data stored in the eFuse IP, based on the serial data received through the serial data line; and a clock control, configured to provide a clock signal to control operations of the eFuse controller.

The eFuse OTP memory may include a serial data input pin which is connected to the serial data line through an open drain input/output device, and is configured to receive the serial data from the I2C master; a serial data output pin which is connected to the serial data line through the open drain input/output device, and is configured to output data to the I2C master; and a serial data output enable pin which is configured to output a signal controlling the open drain input/output device such that the serial data input pin or the serial data output pin is connected to the serial data line.

The I2C slave is configured to may be configured to receive a data write condition through the serial data line in a first cycle, receive first data to be programmed in the eFuse IP through the serial data line in a second cycle, receive an address of the eFuse IP to program the first data through the serial data line in a third cycle, and write the first data to the address of the eFuse IP, based on the received data write condition.

The data write condition may include at least one of a fusing current value to be used while writing the first data to the address of the eFuse IP, whether to select a read mode, or whether to check a margin of a resistance value of an initial eFuse.

The I2C slave may be further configured to receive a chip address, an R/W bit, a command register address, and the data write condition through the serial data line in the first cycle, and store the data write condition in the command register address of the register block, receive the chip address, the R/W bit, a data register address, and the first data to be programmed in the eFuse IP through the serial data line in the second cycle, and store the first data in the data register address of the register block, receive the chip address, the R/W bit, an address register address, and the address of the eFuse IP through the serial data line in the third cycle, and store the address of the eFuse IP in the address register address of the register block, and transmit a first ack signal through the serial data line, every predetermined period in each cycle, and wherein the R/W bit may be set such that a write operation is performed in the first cycle, the second cycle, and the third cycle.

The I2C slave may be configured to receive a data read condition through the serial data line in a first cycle, receive an address of the eFuse IP through the serial data line in a second cycle, and transmit second data read from the eFuse IP based on the address of the eFuse IP to the I2C master through the serial data line in a third cycle.

The data read condition may include at least one of whether to select a read mode, or whether to check a margin of a resistance value of an initial eFuse.

The I2C slave may be further configured to receive a chip address, an R/W bit, a command register address, and the data read condition through the serial data line in the first cycle, and store the data read condition in the command register address of the register block, receive the chip address, the R/W bit, and the address of the eFuse IP through the serial data line in the second cycle, receive the chip address and the R/W bit through the serial data line in the third cycle, and transmit, through the serial data line, the second data read from the eFuse IP based on the address of the eFuse IP to the I2C master, and transmit a first ack signal through the serial data line, every predetermined period in each cycle.

The R/W bit may indicate which of a write operation and a read operation is performed in a corresponding cycle, and is set to indicate that the write operation is performed in the first cycle and in the second cycle and to indicate that the read operation is performed in the third cycle.

The I2C slave may be further configured to transmit, through the serial data line in the third cycle, the second data read from the eFuse IP based on the address of the eFuse IP to the I2C master, and receive a second ack signal indicating that the read operation is completed.

In a general aspect, an eFuse one-time programmable (OTP) memory operation method includes receiving a data write condition through a serial data line in a first cycle; receiving first data to be programmed in an eFuse intellectual property (IP) through the serial data line in a second cycle, receiving an address of the eFuse IP through the serial data line in a third cycle, and writing the first data to the address of the eFuse IP, based on the received data write condition.

The receiving the data write condition may include receiving a chip address, an R/W bit, a command register address, and the data write condition through the serial data line in the first cycle; and storing the data write condition in the command register address of a register block, wherein the R/W bit indicates which of a write operation and a read operation is performed in a corresponding cycle, and wherein the data write condition comprises at least one of a fusing current value to be used while writing the first data to the address of the eFuse IP, whether to select a read mode, or whether to check a margin of a resistance value of an initial eFuse.

The receiving the first data to be programmed in the eFuse IP may include receiving the chip address, the R/W bit, a data register address, and the data to be programmed in the eFuse IP through the serial data line in the second cycle; and storing the first data to be programmed in the eFuse IP in the data register address of the register block.

The receiving the address of the eFuse IP may include receiving the chip address, the R/W bit, an address register address, and the address of the eFuse IP through the serial data line in the third cycle; and storing the address of the eFuse IP in the address register address of the register block.

The eFuse OTP memory may be configured to support inter integrated circuit (I2C) communication.

In a general aspect, an eFuse operation method includes receiving a data read condition through a serial data line in a first cycle; receiving an address of an eFuse intellectual property (IP) through the serial data line in a second cycle; and transmitting second data read from the eFuse IP based on the address of the eFuse IP to an inter integrated circuit (I2C) master through the serial data line in a third cycle.

The receiving the data read condition may include receiving a chip address, an R/W bit, a command register address, and the data read condition through the serial data line in the first cycle; and storing the data read condition in the command register address of a register block, wherein the R/W bit indicates which of a write operation and a read operation is performed in a corresponding cycle, and wherein the data read condition comprises at least one of whether to select a read mode, or whether to check a margin of a resistance value of an initial eFuse.

The receiving the address of the eFuse IP may include receiving the chip address, the R/W bit, and the address of the eFuse IP, through the serial data line in the second cycle.

The transmitting the second data read from the eFuse IP based on the address of the eFuse IP to the I2C master may include receiving the chip address and the R/W bit through the serial data line in the third cycle; and transmitting the second data read from the eFuse IP based on the address of the eFuse IP to the I2C master through the serial data line, wherein the R/W bit received in the third cycle indicates that the read operation is performed in the third cycle.

The operation method may further include receiving an ack signal indicating that the data read operation is completed after transmitting the second data through the serial data line.

In a general aspect, an eFuse inter integrated circuit (I2C) includes an eFuse intellectual property (IP), and an I2C slave, comprising a register block, wherein the register block is configured to store control data received through an I2C communication from an I2C master, and read data from the eFuse IP or write data to the eFuse IP based on the received control data, and wherein the control data comprises at least one of a data write condition of the eFuse IP, a data read condition of the eFuse IP, an address of the eFuse IP, and data to be written to the eFuse IP.

The data write condition may include at least one of a fusing current value implemented when programming the eFuse IP, a read mode selection value, and a margin check value of a resistance value of an initial eFuse cell.

The data read condition may include at least one of a fusing current value applied to read the data of the eFuse IP, a read mode selection value, and a margin check value of a resistance value of an initial eFuse cell.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
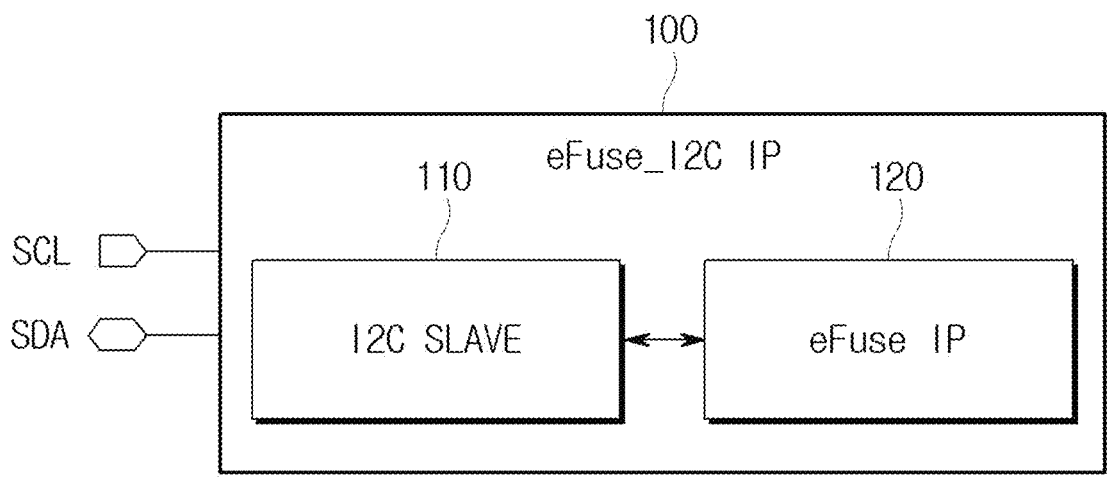
FIG. 1 illustrates an example structure of an example eFuse one-time programmable memory which supports inter integrated circuit (I2C) communication, in accordance with one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness, noting that omissions of features and their descriptions are also not intended to be admissions of their general knowledge.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Throughout the specification, when an element, such as a layer, region, or substrate is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

The terminology used herein is for the purpose of describing particular examples only, and is not to be used to limit the disclosure. As used herein, the singular forms "a," "an," and "the" are intended to include the plural forms as well, unless the context clearly indicates otherwise. As used herein, the term "and/or" includes any one and any combination of any two or more of the associated listed items. As used herein, the terms "include," "comprise," and "have" specify the presence of stated features, numbers, operations, elements, components, and/or combinations thereof, but do not preclude the presence or addition of one or more other features, numbers, operations, elements, components, and/or combinations thereof.

In addition, terms such as first, second, A, B, (a), (b), and the like may be used herein to describe components. Each of these terminologies is not used to define an essence, order, or sequence of a corresponding component but used merely to distinguish the corresponding component from other component(s).

Unless otherwise defined, all terms, including technical and scientific terms, used herein have the same meaning as commonly understood by one of ordinary skill in the art to which this disclosure pertains and after an understanding of the disclosure of this application. Terms, such as those defined in commonly used dictionaries, are to be interpreted as having a meaning that is consistent with their meaning in the context of the relevant art and the disclosure of this application, and are not to be interpreted in an idealized or overly formal sense unless expressly so defined herein.

Also, in the description of example embodiments, detailed description of structures or functions that are thereby known after an understanding of the disclosure of the present application will be omitted when it is deemed that such description will cause ambiguous interpretation of the example embodiments.

One or more examples relate to an eFuse IP including a control circuit that enables writing/reading of data to/from the eFuse IP by implementing I2C communication, and an operation method thereof.

In one or more examples, an eFuse which includes a control circuit that performs writing/reading of data to/from the eFuse IP with I2C communication is implemented and provided to a user after being silicon-proven, so that problems which may occur during the process in which the user develops the product by using the eFuse IP can be minimized, and a product or implementation period of the customer can be reduced, and manufacturing flexibility can be improved. Since the example eFuse supports I2C communication, it can be implemented in all of the environments that support I2C communication interfaces.

Hereinafter, examples will be described in detail with reference to the accompanying drawings, and like reference numerals in the drawings refer to like elements throughout.

Figure 2:
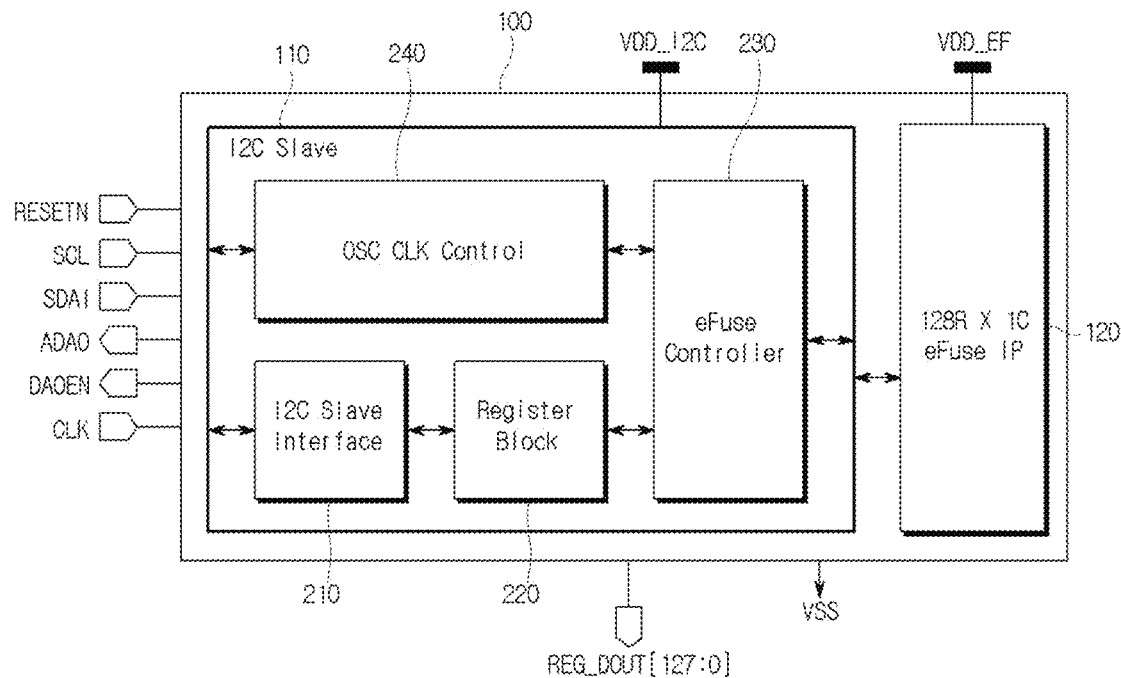
FIG. 2 illustrates a detailed structure of an example eFuse IP which supports I2C communication, in accordance with one or more embodiments.

FIG. 1 illustrates an example structure of an example eFuse one-time programmable (OTP) memory (hereinafter, referred to as eFuse IP or eFuse) which supports I2C communication, in accordance with one or more examples. In the following examples, the eFuse OTP memory which supports the I2C communication may be referred to as an eFuse_I2C intellectual property (eFuse_I2C IP). Hereinafter, at least one component of FIG. 1 will be described in detail with reference to FIG. 2. FIG. 2 illustrates a detailed structure of the eFuse IP which supports the I2C communication, in accordance with one or more embodiments.

Referring to FIG. 1, the eFuse_I2C IP 100 may include an I2C slave 110 and an eFuse IP 120.

In one or more examples, the I2C slave 110 may be a control circuit which receives control data through the I2C communication and writes/reads data to/from the eFuse IP 120 based on the received control data. The I2C communication is a standardized serial interface and is a communication protocol to transmit and receive data between chips, based on a serial data (SDA) signal and a serial clock (SCL) signal. The I2C communication may be performed 1:n between a master chip and a plurality of slave chips. The master chip may lead communication by controlling the start and end of the communication and transmission and reception of data, and the plurality of slave chips may be controlled by the master chip.

In an example, the I2C slave 110 may be a slave chip that is controlled by a master chip (e.g., an application processor (AP) or a micro controller unit (MCU)) through the I2C communication.

In one of more examples, the I2C slave 110 may write data to a specific address of the eFuse IP 120, or may read data written (recorded or programmed) to a specific address of the eFuse IP 120, based on a serial clock (SCL) signal and a serial data (SDA) signal.

In one or more examples, the I2C slave 110 may include, as illustrated in FIG. 2, an I2C slave interface 210, a register block 220, an eFuse controller 230, and an OSC clock control 240.

In one or more examples, the I2C slave interface 210 may be configured with logic for I2C communication with an I2C master (not shown) (e.g., AP or an MCU). In an example, the register block 220 may receive and store serial data received from the I2C master through the I2C slave interface 210, and store data read from the eFuse IP 120. In a non-limited example, the serial data may include at least one of a data write condition, a data read condition, an address of the eFuse IP 120, or data to be written in the eFuse IP 120.

In an example, the register block 220 may obtain and store an address, a write condition of the eFuse IP 120, a read condition of the eFuse IP 120, and/or data to be programmed (recorded) to the eFuse IP 120 which are provided from the I2C master through the I2C slave interface 210. In an example, the register block 220 may include, a command register, a data register, or an address register. In an example, the register block 220 may store, in the address register, the address of the eFuse IP 120 provided from the I2C master, and may store, in the command register, the write condition of the eFuse IP 120 and/or the read condition of the eFuse IP 120 which are provided from the I2C master. The register block 220 may store, in the data register, data provided from the I2C master, that is, the data to be programmed (recorded) to the eFuse IP 120.

In an example, the eFuse controller 230 may generate and process a control signal to perform a write operation and/or a read operation on the eFuse IP 120. The eFuse controller 230 may perform a data write operation or a data read operation on the eFuse IP 120 in accordance with the address, data, and/or conditions of the eFuse IP 120 stored in the register block 220. In an example, in the register block 220, the eFuse controller 230 may obtain the write condition of the eFuse IP 120, the address of the eFuse IP 120, and the data to be written (programmed) to the eFuse IP 120, and, based on this, may generate a control signal to write data to the eFuse IP 120, and transmit the data to the eFuse IP 120. In an example, in the register block 220, the eFuse controller 230 may obtain the read condition of the eFuse IP 120 and the address of the eFuse IP 120, and, based on this, may generate a control signal to read the data written to the eFuse IP 120 transmit the data to the eFuse IP 120.

In an example, when power is turned off and then supplied again, the eFuse controller 230 may read values of all addresses of the eFuse IP 120 and store the read values in the register block 220. The values stored in the register block 220 may be output to a device external to the eFuse_I2C IP 100 through an output REG_DOUT, and may be provided as an input signal (or control signal) of at least one component of a customer designed circuit.

In one or more examples, the OSC clock control 240 may control a clock application to the eFuse controller 230. In an example, the OSC clock control 240 may provide a clock to the eFuse controller 230 only when the eFuse controller 230 operates. In an example, the OSC clock control 240 may apply a clock signal to the eFuse controller 230 only while the data write operation or the data read operation on the eFuse IP 120 is performed.

In one or more examples, the eFuse IP 120 may be an eFuse that writes and reads data in units of one bit. In an example, the eFuse IP 120 performs an operation of writing data to a specific IP of the eFuse IP 120 or an operation of reading data written to the specific IP in accordance with the control signal provided from the eFuse controller 230. In an example, the eFuse IP 120 may be, as illustrated in FIG. 2, a 128-bit eFuse memory having a 128R×1C structure.

In one or more examples, the eFuse_I2C IP 100 may include a reset (RESETN) PIN that receives a reset signal for an initial setting, a serial clock (SCL) pin to receive a serial clock signal used for the I2C communication, a serial data input (SDAI) pin to receive input data from the I2C master, a serial data output (SDAO) pin to provide or transmit data to the I2C master, a serial data output enable (SDAOEN) pin to output a control signal for bidirectional I/O in order to provide a data and/or acknowledgment (shortened to ack) signal to the I2C master, a clock (CLK) pin to receive a clock signal used for the operation of the eFuse controller 230, and an output (REG_DOUT) pin to output data programmed in the eFuse IP 120 to the customer designed circuit side.

In an example, the data programmed in the eFuse IP 120, which is transmitted to the customer designed circuit side through the output pin, may be used as a control signal. In an example, the number of output (REG_DOUT) pins may be the same as the number of rows of the structure of the eFuse IP 120. In an example, if the eFuse IP 120 has a 128R×1C structure, the number of output pins may be 128.

In order to perform the I2C communication with an external chip in the eFuse_I2C IP 100 as described above, it may be beneficial to transmit and receive signals related to the serial clock (SCL) and the serial data (SDA) through an open drain bidirectional input/output (I/O). In an example, when the eFuse_I2C IP 100 is implemented with a chip, a pull-up resistor for a corresponding pin may be applied to an external source. In an example, the I2C slave 110 and the eFuse IP 120 of the eFuse_I2C IP 100 may receive power through different power supply terminals. In an example, the I2C slave 110 may receive power through VDD_I2C, and the eFuse IP 120 may receive power through VDD_EF. In an example, the ground of the eFuse_I2C IP 100 may be connected to an external common ground.

Figure 3:
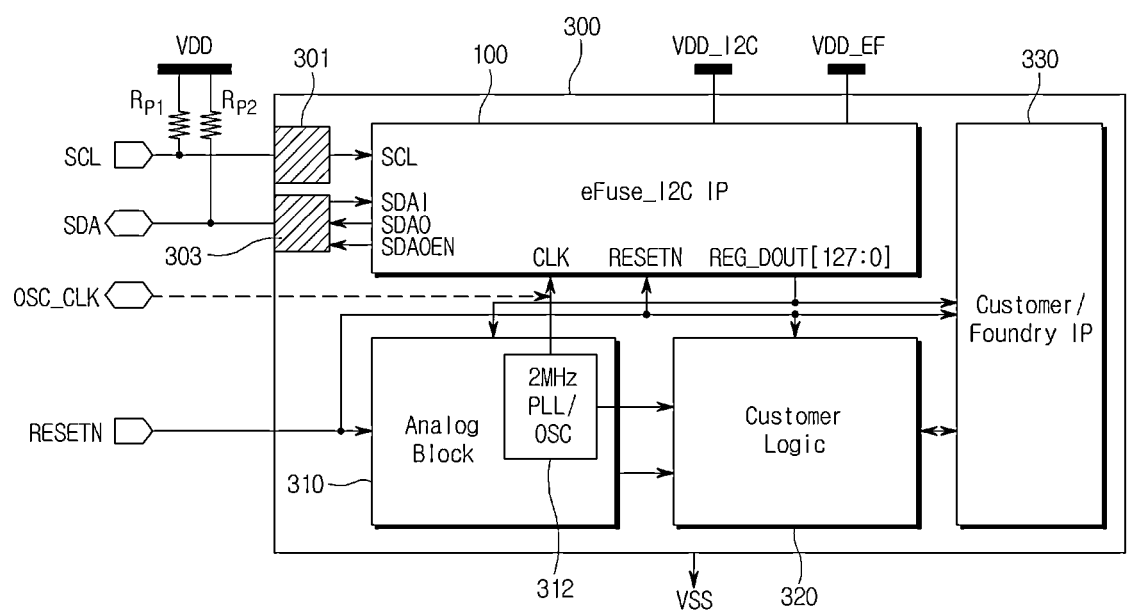
FIG. 3 illustrates a user patterned circuit structure to which an example eFuse IP that supports the I2C communication is applied, in accordance with one or more embodiments.

FIG. 3 illustrates a customer designed circuit structure to which the eFuse IP supporting the I2C communication is applied, in accordance with one or more embodiments.

Referring to FIG. 3, a customer designed circuit 300 including the eFuse_I2C IP 100 may include a first open drain I/O 301 and a second open drain I/O 303.

In one or more examples, the first open drain I/O 301 may transmit a serial clock signal provided from the I2C master to the serial clock (SCL) pin of the eFuse_I2C IP 100. In an example, a first pull-up resistor RP1 may be connected to an external serial clock signal line connected to the first open drain I/O 301. Accordingly, the serial clock (SCL) pin of the eFuse_I2C IP 100, together with the first pull-up resistor RP1, may be connected to the external serial clock signal line through the first open drain I/O 301.

In one or more examples, the second open drain I/O 303 may transmit the data provided from the I2C master to the serial data input (SDAI) pin of the eFuse_I2C IP 100, and may transmit data output from the serial data output (SDAO) pin to the I2C master. In an example, a second pull-up resistor RP2 may be connected to an external serial data signal line (SDA) connected to the second open drain I/O 303. Accordingly, the serial data input (SDAI) pin and the serial data output (SDAO) pin of the eFuse_I2C IP 100, together with the second pull-up resistor RP2, may be connected to an external serial data line (SDA) through the second open drain I/O 303.

In an example, the second open drain I/O 303 may be a bidirectional I/O, and may open and close an output path in accordance with an output control signal from the serial data output enable (SDAOEN) pin of the eFuse_I2C IP 100. In an example, while an enable signal for the output is being received from the serial data output enable (SDAOEN) pin of the eFuse_I2C IP 100, the second open drain I/O 303 connects the serial data output (SDAO) pin and the external serial data line (SDA), thereby transmitting the data or ack signal which is output from the serial data output (SDAO) pin to the I2C master. In an example, while a disable signal for the output is being received from the serial data output enable (SDAOEN) pin of the eFuse_I2C IP 100, the second open drain I/O 303 connects the serial data input (SDAI) pin and the external serial data line, thereby providing the data provided through an external serial data (SDA) line to the serial data input (SDAI) pin.

In one or more examples, the eFuse_I2C IP 100 may share a reset signal and a clock signal with other circuits within the customer designed circuit 300. In an example, the reset signal input to the customer designed circuit 300 from an external reset signal line may be provided to the eFuse_I2C IP 100, an analog block 310, a customer logic 320, and a customer/foundry IP 330 within the customer designed circuit 300. According to the embodiment, the eFuse_I2C IP 100 may receive a clock signal from PLL/OSC 312 of the analog block 310.

In an example, the customer designed circuit 300 of FIG. 3 may be a power management integrated circuit (PMIC) chip or a core. In an example, the eFuse_I2C IP 100 may store parameters necessary to drive the PMIC in the eFuse OTP memory included in the eFuse_I2C IP 100, that is, the eFuse IP 120, and may output, through the output REG_D-OUT, values of the parameters stored in the eFuse IP 120, so that other logic or IP within the PMIC chip or core can use the values.

The customer designed circuit 300 structure shown in FIG. 3 is merely an example, and the one or more examples will not be limited thereto.

As described above, the eFuse_I2C IP 100, in accordance with one or more embodiments, may be implemented in the customer designed circuit 300, so that the write/read operations on the eFuse IP 120 can be performed only by using two pins corresponding to the serial clock and serial data. Accordingly, the number of pins necessary for the chip of the customer designed circuit 300 may be reduced, design complexity may be reduced, and the time necessary for product development may be saved.

In one or more examples, the eFuse_I2C IP 100 may perform the write/read operations on the eFuse IP 120 based on an 8-bit-based I2C communication method. In one or more examples, whenever the eFuse_I2C IP 100 and the I2C master transmit and receive 8-bit data, they transmit and receive the ack signal, so that they may determine whether communication is abnormal between the I2C master and the eFuse_I2C IP 100, i.e., the I2C slave.

In one or more examples, the operation to write or read 1-bit data to or from the eFuse IP 120 within the eFuse_I2C IP 100 may be performed over three cycles. Each cycle can be distinguished based on the serial clock (SCL) signal. During one cycle, operations where 8-bit data is transmitted and received, and a 1-bit ack signal is transmitted and received, may be performed up to three times.

In an example, in order to write a 1-bit data to the eFuse IP 120 of the eFuse_I2C IP 100 through the I2C communication, the I2C master may call a slave chip address three times during three cycles and may transmit a data write condition, the address of the eFuse IP 120, and data to be programmed in the eFuse IP 120 in each cycle. In an example, the I2C master may transmit a data setting the data write condition together with the address of the slave chip to the eFuse_I2C IP 100 through the serial data (SDA) line during a first cycle, and may transmit data to be programmed in the eFuse IP 120 together with the address of the slave chip to the eFuse_I2C IP 100 through the serial data (SDA) line during a second cycle. The I2C master may transmit data to specify the address of the eFuse IP 120 together with the address of the slave chip to the eFuse_I2C IP 100 through the serial data (SDA) line during a third cycle. The address of the slave chip may be the address of the eFuse_I2C IP 100, the address of the I2C slave 110 of the eFuse_I2C IP 100, or the address of the customer designed circuit 300 including the eFuse_I2C IP 100. Accordingly, the eFuse_I2C IP 100 may obtain the data write condition, the data to be programmed, and the specified address of the eFuse IP 120 during the three cycles, thereby recording, in the specified address of the eFuse IP 120 under the data write condition, the obtained data to be programmed.

In an example, in order to read 1-bit data from the eFuse IP 120 of the eFuse_I2C IP 100 through the I2C communication, the I2C master may call the slave chip address three times during the three cycles, may transmit a data read condition and the address of the eFuse IP 120 in the first and second cycles, and may obtain data of the specified address of the eFuse IP 120 in the third cycle. In an example, the I2C master may transmit data to set the data read condition together with the address of the slave chip to the eFuse_I2C IP 100 through the serial data line (SDA) in the first cycle, and may transmit the data to specify the address of the eFuse IP 120 together with the address of the slave chip to the eFuse_I2C IP 100 through the serial data line (SDA) in the second cycle. In the third cycle, the I2C master may receive the data of the specified address of the eFuse IP 120 from the eFuse_I2C IP 100 through the serial data line (SDA). The address of the slave chip may be the address of the eFuse_I2C IP 100, the address of the I2C slave 110 of the eFuse_I2C IP 100, or the address of the customer designed circuit 300 including the eFuse_I2C IP 100. Accordingly, the eFuse_I2C IP 100 may obtain the data read conditions and information on the specified address of the eFuse IP 120 during the first and second cycles, and may transmit data read from the eFuse IP 120 based on the obtained data read conditions and the information on the specified address of the eFuse IP 120 to the I2C master through the serial data (SDA) line during the third cycle.

In the one or more examples, the data write operation of the eFuse_I2C IP 100 will be described in more detail in FIGS. 4, 5, 6A, and 6B, and the data read operation of the eFuse_I2C IP 100 will be described in more detail in FIGS. 7, 8, 9A, and 9B.

Figure 4:
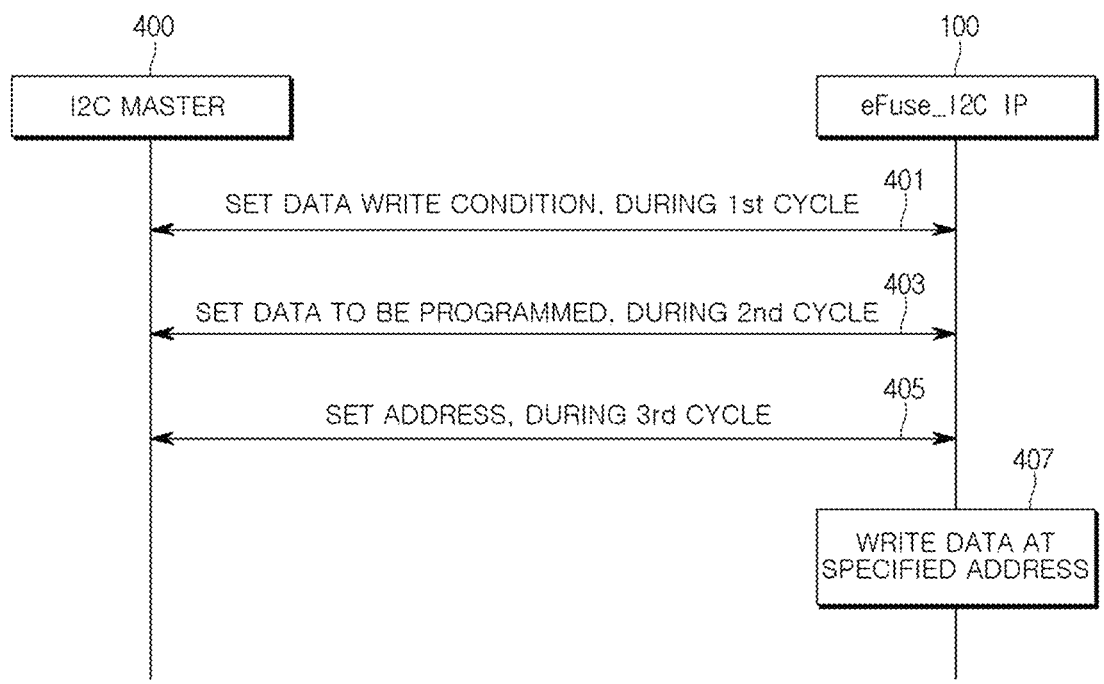
FIG. 4 illustrates a flowchart illustrating the performing of a data write operation between an I2C master and an eFuse_I2C IP, in accordance with one or more embodiments.
Figure 5:
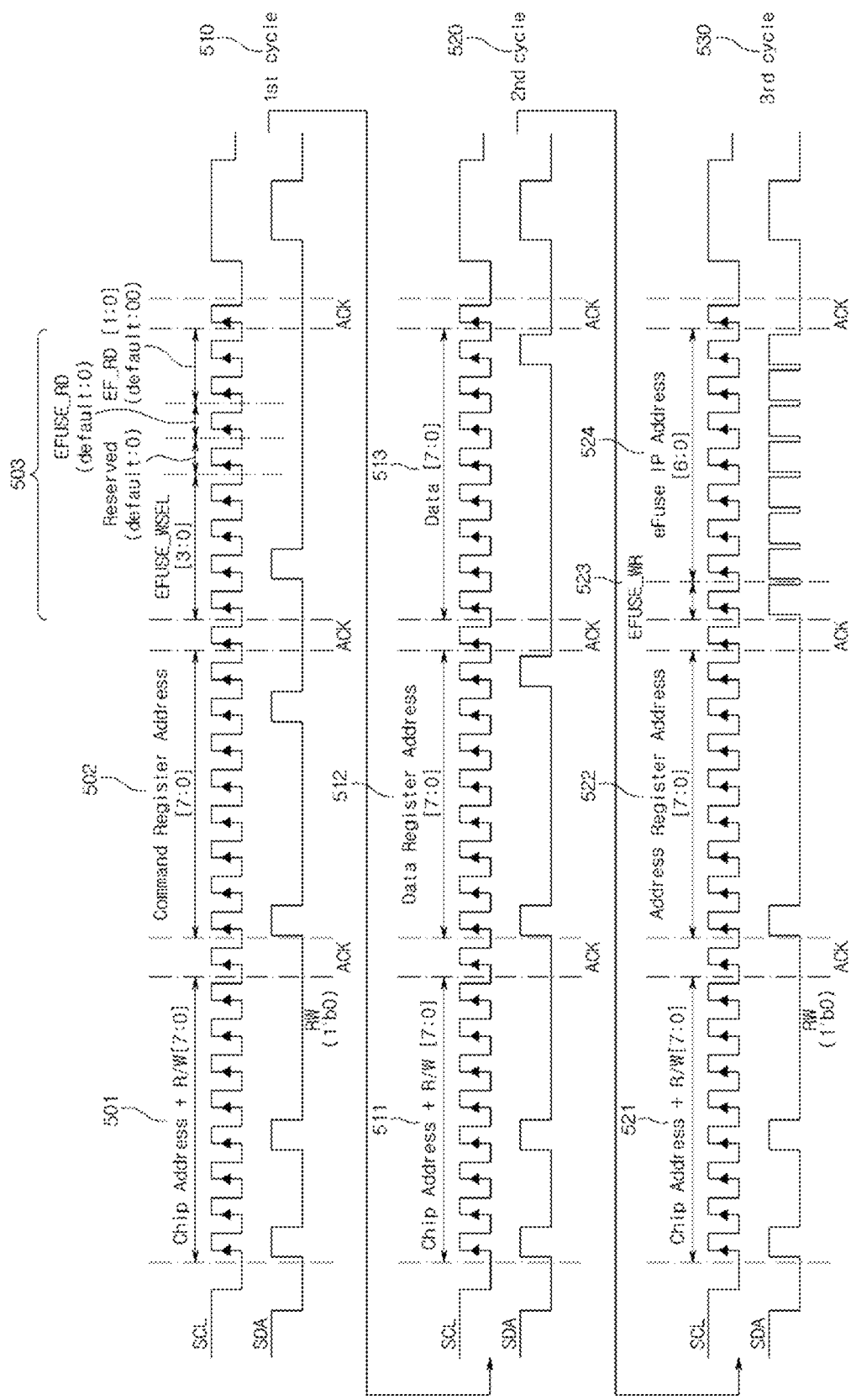
FIG. 5 illustrates an example of a signal structure while an example I2C master and an example eFuse_I2C IP are performing the data write operation, in accordance with one or more embodiments.

FIG. 4 is a flowchart illustrating the performing of the data write operation between the I2C master and the eFuse_I2C IP, in accordance with one or more embodiments. At least some operations of FIG. 4 will be described with reference to FIG. 5. FIG. 5 illustrates an example of a signal structure while the I2C master and the eFuse_I2C IP are performing the data write operation, in accordance with one or more embodiments. Here, the eFuse_I2C IP 100 may be the eFuse_I2C IP 100 of FIGS. 1 to 3, and an I2C master 400 may be a master chip which leads the I2C communication with the eFuse_I2C IP 100 by controlling the start and end of the I2C communication and transmission and reception of data. The I2C master 400 may be, as a non-limiting example, an application processor (AP) or a micro controller unit (MCU).

Referring to FIG. 4, in operation 401, the I2C master 400 and the eFuse_I2C IP 100 may set the data write condition in the eFuse_I2C IP 100 through the I2C communication during the first cycle.

In an example, as illustrated in FIG. 5, the I2C master 400 may transmit an address of the slave chip and R/W bit 501, a command register address 502, and a data write condition 503 through the serial data (SDA) line during the first cycle 510. The address of the slave chip may be used to inform the slave chip to be controlled by the I2C master 400, when a plurality of I2C slaves are connected to the I2C master 400. The address of the slave chip may be the address of the eFuse_I2C IP 100, the address of the I2C slave 110 of the eFuse_I2C IP 100, or the address of the customer designed circuit 300 including the eFuse_I2C IP 100. The R/W bit may indicate whether a corresponding cycle is a write operation or a read operation from the standpoint of the I2C master 400. In an example, the R/W bit may be set to 1'b0 when the corresponding cycle is the write operation. The command register address is an address of a register included in the register block 220 of the eFuse_I2C IP 100 and may indicate an address at which the data write condition 503 is to be stored. The data write condition 503 may include, as illustrated in FIG. 5, at least one of a fusing current value (EFUSE_WSEL [3:0]) to be used when programming the eFuse IP 120, a read mode selection value (EFUSE_RD), or a margin check value (EF_RD [1:0]) of a resistance value of an initial eFuse cell. The read mode selection value may be set to 0 which corresponds to the data write mode. While the number of data bits transmitted in the corresponding cycle is 8, when the number of bits for the above-described data write condition 503 is less than 8, the remaining bits may be set as reserved bits that can be used later if necessary.

In an example, the eFuse_I2C IP 100 may receive the address of the slave chip and the R/W bit 501, the command register address 502, and the data write condition 503, transmitted from the I2C master 400 through the serial data input (SDAI) pin during the first cycle 510. Whenever the eFuse_I2C IP 100 receives 8-bit data, the eFuse_I2C IP 100 may transmit, to the I2C master 400, an ack signal which indicates that the 8-bit data has been normally received. The ack signal may be set to 1'b0 so as to indicate that the 8-bit data has been normally received. The eFuse_I2C IP 100 may store and/or set the data write condition at the corresponding address of the register block 220, based on the command register address.

In operation 403, the I2C master 400 and the eFuse_I2C IP 100 may set data to be programmed in the eFuse IP 120 through the I2C communication during the second cycle.

In one or more examples, as illustrated in FIG. 5, the I2C master 400 may transmit an address of the slave chip and R/W bit 511, a data register address 512, and data 513 through the serial data (SDA) line during the second cycle 520. The address of the slave chip and R/W bit 511 may be the same as the address of the slave chip and R/W bit transmitted in step 401. The data register address 512 is an address of a register included in the register block 220 of the eFuse_I2C IP 100 and may indicate an address at which the data is to be stored. The data 513 may be programmed in the eFuse IP 120. If the eFuse IP 100 has the 128R×1C structure shown in FIG. 2, only 1-bit of data is valid for each address. Accordingly, only the lowest bit (Data [0]) among the 8 bits within the data 513 is valid and the remaining bits may not be valid.

In an example, the eFuse_I2C IP 100 may receive the address of the slave chip and R/W bit 511, the data register address 512, and the data to be programmed in the eFuse IP 120, transmitted from the I2C master 400 through the serial data input (SDAI) pin during the second cycle 520. Whenever the eFuse_I2C IP 100 receives 8-bit data, the eFuse_I2C IP 100 may transmit, to the I2C master 400, an ack signal which indicates that the 8-bit data has been normally received. The eFuse_I2C IP 100 may store and/or set the data to be programmed in the eFuse IP 120 at a corresponding address of the register block 220, based on the data register address.

In operation 405, the I2C master 400 and the eFuse_I2C IP 100 may set an address of the eFuse IP 120 where data is to be programmed, through the I2C communication during the third cycle.

In an example, as illustrated in FIG. 5, the I2C master 400 may transmit an address of the slave chip and R/W bit 521, an address register address 522, a write mode set bit (EFUSE_WR) 523, and an eFuse IP address 524 through the serial data (SDA) line during the third cycle 530. The address of the slave chip and R/W bit 521 may be the same as the address of the slave chip and R/W bit transmitted in operation 401. The address register address 522 is an address of a register included in the register block 220 of the eFuse_I2C IP 100, and may indicate an address at which the eFuse IP address 524 to be transmitted later is to be stored. The write mode set bit 523 may be an optional bit, and may be set to 1'b1. The eFuse IP address 524 may indicate the address of the eFuse IP 120 where data is to be programmed (or recorded).

In an example, the eFuse_I2C IP 100 may receive the address of the slave chip and R/W bit 521, the address register address 522, the write mode set bit 523, and the eFuse IP address 524, transmitted from the I2C master 400 through the serial data input (SDAI) pin during the third cycle 530. Whenever the eFuse_I2C IP 100 receives 8-bit data, the eFuse_I2C IP 100 may transmit, to the I2C master 400, an ack signal which indicates that the 8-bit data has been normally received. The eFuse_I2C IP 100 may store and/or set the address of the eFuse IP 120 at a corresponding address of the register block 220, based on the address register address.

In one or more examples, the eFuse_I2C IP 100 may obtain the data write condition, the data to be programmed in the eFuse IP 120, and the address of the eFuse IP 120 during the three cycles 510, 520, and 530, and may perform an operation of writing the data to the eFuse IP 120 at the address of the eFuse IP 120 under the data write condition in operation 407, so that one bit of the eFuse IP 120 can be programmed.

In an example, when the data write condition (or programming condition) is not changed during multi-bit programming, a cycle in which the data write condition is set may be performed only once. In an example, only when an initial 1 bit is programmed, a data write condition set operation such as the operation 401 may be performed, and when the subsequent bits are programmed, the data write condition set operation may be omitted and only operations for the second cycle and the third cycle may be repeated.

Figure 6A:
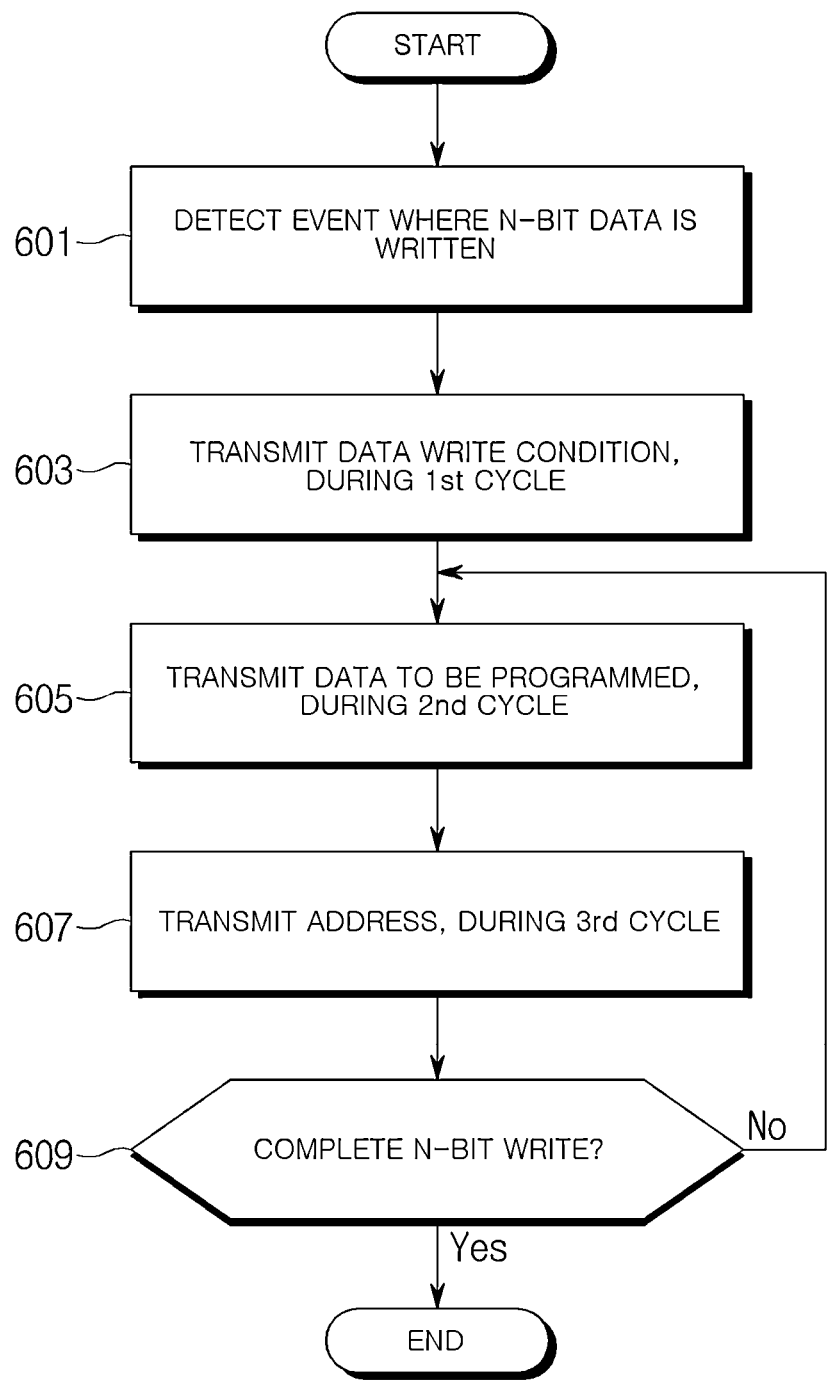
FIG. 6A illustrates a flowchart of the performing of a data write operation in an example eFuse_I2C IP in an example I2C master, in accordance with one or more embodiments.

FIG. 6A is a flowchart illustrating the performing of an operation to write data to the eFuse_I2C IP in the I2C master, in accordance with one or more embodiments. In an example, the I2C master may be the I2C master 400 of FIG. 4, and the eFuse_I2C IP may be the eFuse_I2C IP 100 of FIG. 4. In the example of FIG. 6A, each operation may be sequentially performed, and may not be necessarily sequentially performed. In an example, the order of each operation may be changed, and at least two operations may be performed in parallel.

Referring to FIG. 6A, in operation 601, the I2C master 400 may detect an event where n-bit data is written to the eFuse IP 120 of the eFuse_I2C IP 100. The event where n-bit data is written may be detected based on a user's input and/or a specified rule.

In operation 603, the I2C master 400 may transmit the data write condition to the eFuse_I2C IP 100 through the I2C communication during the first cycle. In an example, the I2C master 400 may transmit the address of the slave chip, the R/W bit, the command register address, and the data write condition through the serial data (SDA) line during the first cycle. The address of the slave chip, the R/W bit, the command register address, and/or the data write condition may be configured as described in operation 401 of FIG. 4.

In operation 605, the I2C master 400 may transmit data to be programmed to the eFuse IP 120 through the I2C communication during the second cycle. In an example, the I2C master 400 may transmit the address of the slave chip, the R/W bit, the data register address, and data through the serial data (SDA) line during the second cycle. The address of the slave chip, the R/W bit, the data register address, and/or data may be configured as described in operation 403 of FIG. 4.

In operation 607, the I2C master 400 may transmit the address of the eFuse IP 120 where data is to be programmed, through the I2C communication during the third cycle. In an example, the I2C master 400 transmits the address of the slave chip, the R/W bit, the address register address, the write mode set bit (EFUSE_WR), and the register address through the serial data (SDA) line during the third cycle. The address of the slave chip, the R/W bit, the address register address, the write mode set bit (EFUSE_WR), and the register address may be configured as described in operation 405 of FIG. 4.

In operation 609, the I2C master 400 may determine whether the data write operation for n bits has been completed. When the data write operation for n bits is not completed, the I2C master 400 may return to operation 605 to repeatedly perform the second cycle in which the data to be programmed is transmitted to the eFuse IP 120 and the third cycle in which the address of the eFuse IP 120 where data is to be programmed is transmitted. In an example, when there is no need to change the data write condition while writing n-bit data to the eFuse IP 120 of the eFuse_I2C IP 100, the I2C master 400 performs for the first time only once the first cycle in which the data write condition is transmitted and can omit the subsequent thereto.

Figure 6B:
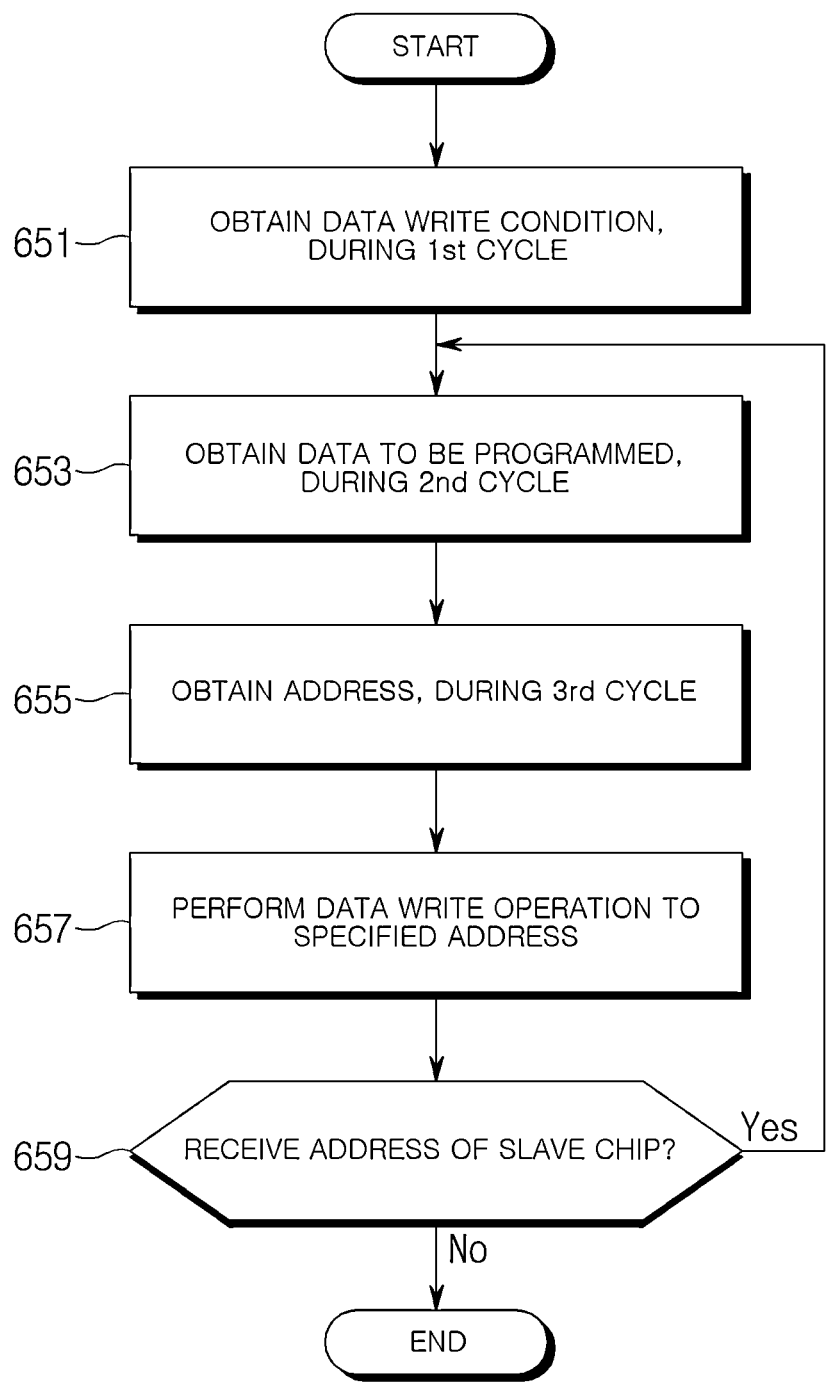
FIG. 6B illustrates a flowchart of the performing of a data write operation in an example eFuse_I2C IP, in accordance with one or more embodiments.

FIG. 6B is a flowchart illustrating an example of performing an operation to write data in the eFuse_I2C IP, in accordance with one or more embodiments. In an example, the I2C master may be the I2C master 400 of FIG. 4, and the eFuse_I2C IP may be the eFuse_I2C IP 100 of FIG. 4. In the embodiment of FIG. 6B, each operation may be sequentially performed, and is not necessarily sequentially performed. For example, the order of each operation may be changed, and at least two operations may be performed in parallel.

Referring to FIG. 6B, in operation 651, the eFuse_I2C IP 100 may receive the data write condition through the I2C communication during the first cycle. In an example, the eFuse_I2C IP 100 may receive the address of the slave chip, the R/W bit, the command register address, and the data write condition transmitted from the I2C master 400 through the serial data input (SDAI) pin during the first cycle. The eFuse_I2C IP 100 may store and/or set the data write condition in the command register within the register block 220, based on the command register address.

In operation 653, the eFuse_I2C IP 100 may obtain the data to be programmed in the eFuse IP 120, through the I2C communication during the second cycle. In an example, the eFuse_I2C IP 100 may receive the address of the slave chip, the R/W bit, the data register address, and the data to be programmed in the eFuse IP transmitted from the I2C master 400 through the serial data input (SDAI) pin during the second cycle. The eFuse_I2C IP 100 may store and/or set the data to be programmed in the eFuse IP 120 in the data register within the register block 220, based on the data register address.

In operation 655, the eFuse_I2C IP 100 may obtain the address of the eFuse IP 120 where data is to be programmed, through the I2C communication during the third cycle. In an example, the eFuse_I2C IP 100 may receive the address of the slave chip, the R/W bit, the address register address, the write mode set bit, and the register address transmitted from the I2C master 400 through the serial data input (SDAI) pin during the third cycle. The eFuse_I2C IP 100 may store and/or set the address of the eFuse IP 120 in the address register within the register block 220, based on the address register address.

In operation 657, the eFuse_I2C IP 100 may perform the write operation on the data received from the I2C master 400 to an address specified by the I2C master 400. In an example, the eFuse_I2C IP 100 may control an environment to write data in accordance with the data write condition obtained in operation 651 (e.g., may control a fusing current value), and perform an operation of writing the data obtained in operation 653 to the address of the eFuse IP 120 obtained in operation 655, so that one bit of the eFuse IP 120 can be programmed.

After performing the data write operation, the eFuse_I2C IP 100 may determine, in operation 659, whether the address of the slave chip is received again. When the address of the slave chip is received again, the eFuse_I2C IP 100 may return to operation 653 and may perform again the operations subsequent to operation 653. In an example, when the address of the slave chip is received again, the eFuse_I2C IP 100 may determine that the data write operation for n bits is not completed, and may perform the operations subsequent to operation 653 again in order to perform the data write operation on other bits where the data write operation has not been performed. When the address of the slave chip is not received again, the eFuse_I2C IP 100 may determine that the data write operation for n bits has been completed.

In FIGS. 6A and 6B described above, by assuming that there is no need to change the data write condition while writing n-bit data to the eFuse IP 120 of the eFuse_I2C IP 100, a method has been described in which the I2C master 400 and the eFuse_I2C IP 100 perform for the first time only once the operation to set the data write condition. However, when it is necessary to change the data write condition for each of n bits while writing n-bit data to the eFuse IP 120 of the eFuse_I2C IP 100, the I2C master 400 and the eFuse_I2C IP 100 should perform the operation to set the data write condition for each bit.

Figure 7:
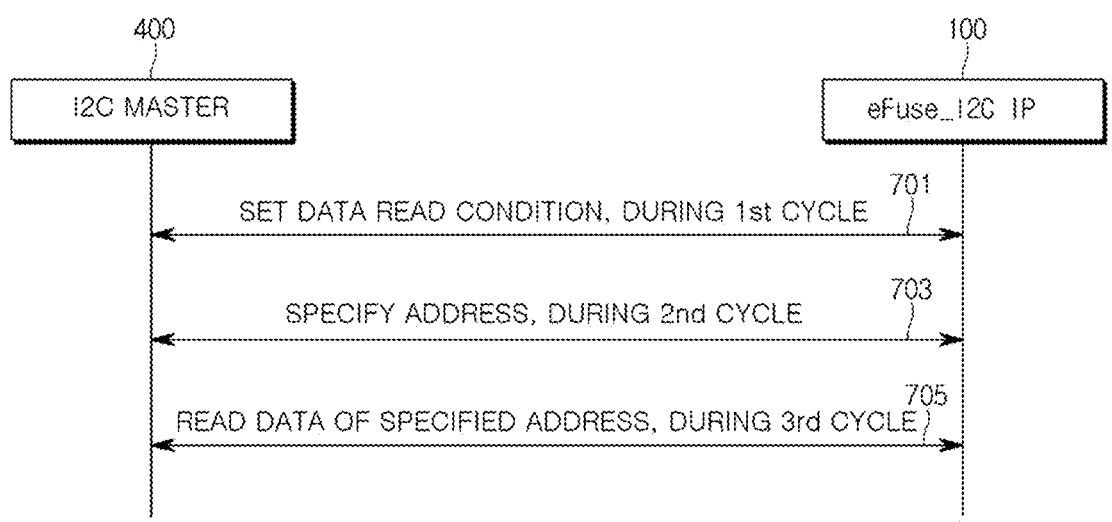
FIG. 7 illustrates a flowchart of the performing of a data read operation between an example I2C master and an example eFuse_I2C IP, in accordance with one or more embodiments.

FIG. 7 is a flowchart illustrating an example of performing the data read operation between the I2C master 400 and the eFuse_I2C IP 100, in accordance with one or more embodiments. At least some operations of FIG. 7 will be described with reference to FIG. 8.

FIG. 7 illustrates an example of a signal structure while the I2C master 400 and the eFuse_I2C IP 100 are performing the data read operation, in accordance with one or more embodiments. In an example, the eFuse_I2C IP 100 may be the eFuse_I2C IP 100 of FIGS. 1 to 3, and the I2C master 400 may be a master chip which leads the I2C communication with the eFuse_I2C IP 100 by controlling the start and end of the I2C communication, and the transmission and reception of data. The I2C master 400 may be, as non-limiting examples, an application processor (AP) or a micro controller unit (MCU).

Referring to FIG. 7, in operation 701, the I2C master 400 and the eFuse_I2C IP 100 may set the data read condition in the eFuse_I2C IP 100 through the I2C communication during the first cycle.

Figure 8:
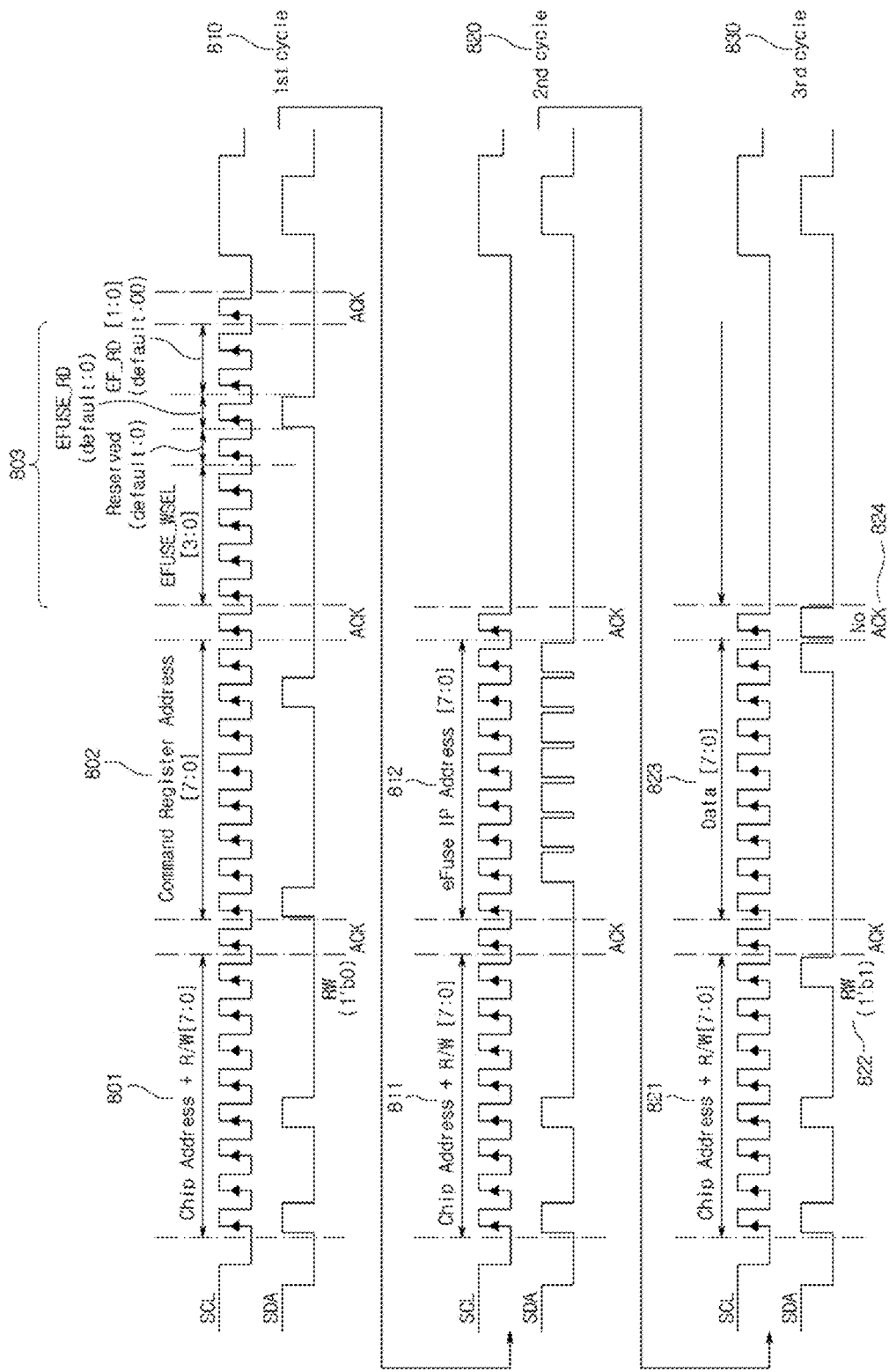
FIG. 8 illustrates an example signal structure while performing a data read operation in an example I2C master and an example eFuse_I2C IP, in accordance with one or more embodiments.

In an example, as illustrated in FIG. 8, the I2C master 400 may transmit an address of the slave chip and R/W bit 801, a command register address 802, and a data read condition 803 through the serial data line (SDA) during a first cycle 810. The address of the slave chip may be the address of the eFuse_I2C IP 100, the address of the I2C slave 110 of the eFuse_I2C IP 100, or the address of the customer designed circuit 300 including the eFuse_I2C IP 100. The R/W bit may indicate whether a corresponding cycle is a write operation or a read operation from the standpoint of the I2C master 400. In the first cycle 810, the R/W bit may be set to 1'b0 corresponding to the write operation. The command register address is an address of a register included in the register block 220 of the eFuse_I2C IP 100 and may indicate an address at which the data read condition 803 is to be stored. The data read condition 803 may include, as illustrated in FIG. 8, at least one of a fusing current value (EFUSE_WSEL [3:0]) to be applied to read the data of the eFuse IP 120, a read mode selection value (EFUSE_RD), or a margin check value (EF_RD [1:0]) of a resistance value of an initial eFuse cell. The read mode selection value may be set to 1'b1 which corresponds to a data read mode. While the number of data bits transmitted in the corresponding cycle is 8, when the number of bits for the above-described data write condition 503 is less than 8, the remaining bits may be set as reserved bits that can be used later if necessary.

In an example, the I2C master 400 may set the data read condition such that the eFuse IP 120 stably operates to block the flow of current, during the data read mode. In an example, in the data read mode, when it is necessary to read the resistance value of an initial fuse cell or the resistance value of the fuse cell after a certain amount of time has elapsed, the I2C master 400 checks the margin check value of the resistance value.

In an example, the eFuse_I2C IP 100 may receive the address of the slave chip and the R/W bit 801, the command register address 802, and the data read condition 803, transmitted from the I2C master 400 through the serial data input (SDAI) pin during the first cycle 810. Whenever the eFuse_I2C IP 100 receives 8-bit data, the eFuse_I2C IP 100 may transmit, to the I2C master 400, an ack signal which indicates that the 8-bit data has been normally received. The eFuse_I2C IP 100 may store and/or set the data read condition at the corresponding address of the register block 220, based on the command register address.

In operation 703, the I2C master 400 and the eFuse_I2C IP 100 may set an address to read data from the eFuse IP 120 through the I2C communication during the second cycle.

In an example, as illustrated in FIG. 8, the I2C master 400 may transmit an address of the slave chip and R/W bit 811 and an eFuse IP address 812 through the serial data (SDA) line during a second cycle 820. The address of the slave chip and R/W bit 811 may be the same as the address of the slave chip and R/W bit transmitted in operation 701. The eFuse IP address 812 may be an address of the eFuse IP 120 from which data is to be read.

In an example, the eFuse_I2C IP 100 may receive the address of the slave chip and R/W bit 811 and the eFuse IP address 812 transmitted from the I2C master 400 through the serial data input (SDAI) pin during the second cycle 820. Whenever the eFuse_I2C IP 100 receives 8-bit data, the eFuse_I2C IP 100 may transmit, to the I2C master 400, an ack signal which indicates that the 8-bit data has been normally received.

In operation 705, the I2C master 400 and the eFuse_I2C IP 100 may read data of the specified address of the eFuse IP 120 through the I2C communication during the third cycle.

In an example, as illustrated in FIG. 8, the I2C master 400 may transmit an address 821 of the slave chip and a R/W bit 822 to the eFuse_I2C IP 100 through the serial data line (SDA) during a third cycle 830, and may then receive data 823 of the specified address of the eFuse IP 120. The address 821 of the slave chip may be the same as the address of the slave chip transmitted in operation 701. The R/W bit 822 may be set to 1'b1 in order to indicate that the read operation is performed in a corresponding cycle. The I2C master 400 may receive the ack signal for the address 821 of the slave chip and the R/W bit 822 through the serial data line (SDA), and may then receive the data 823 of the specified address of the eFuse IP 120, and transmit an ack signal 824 of 1'b1, so that it is possible to detect that the data read operation is completed.

In an example, the eFuse_I2C IP 100 may receive the address 821 of the slave chip and the R/W bit 822 into the eFuse_I2C IP 100 through the serial data input (SDAI) pin during the second cycle 820, and may then transmit the data 823 of the specified address of the eFuse IP 120 through the serial data output (SDAO) pin. After the eFuse_I2C IP 100 transmits the data 823 of the specified address of the eFuse IP 120, the master transmits the ack signal 824 of 1'b1 rather than 1'b0, thereby informing that the data read operation is completed.

In an example, when the multi-bit read operation is performed, if the data read condition is not changed, a cycle in which the data read condition is set may be performed only once. In an example, only when an initial 1 bit is read, a data read condition set operation such as the operation 701 is performed, and when the subsequent bits are read, the data read condition set operation is omitted and only operations for the second cycle and the third cycle can be repeated.

Figure 9A:
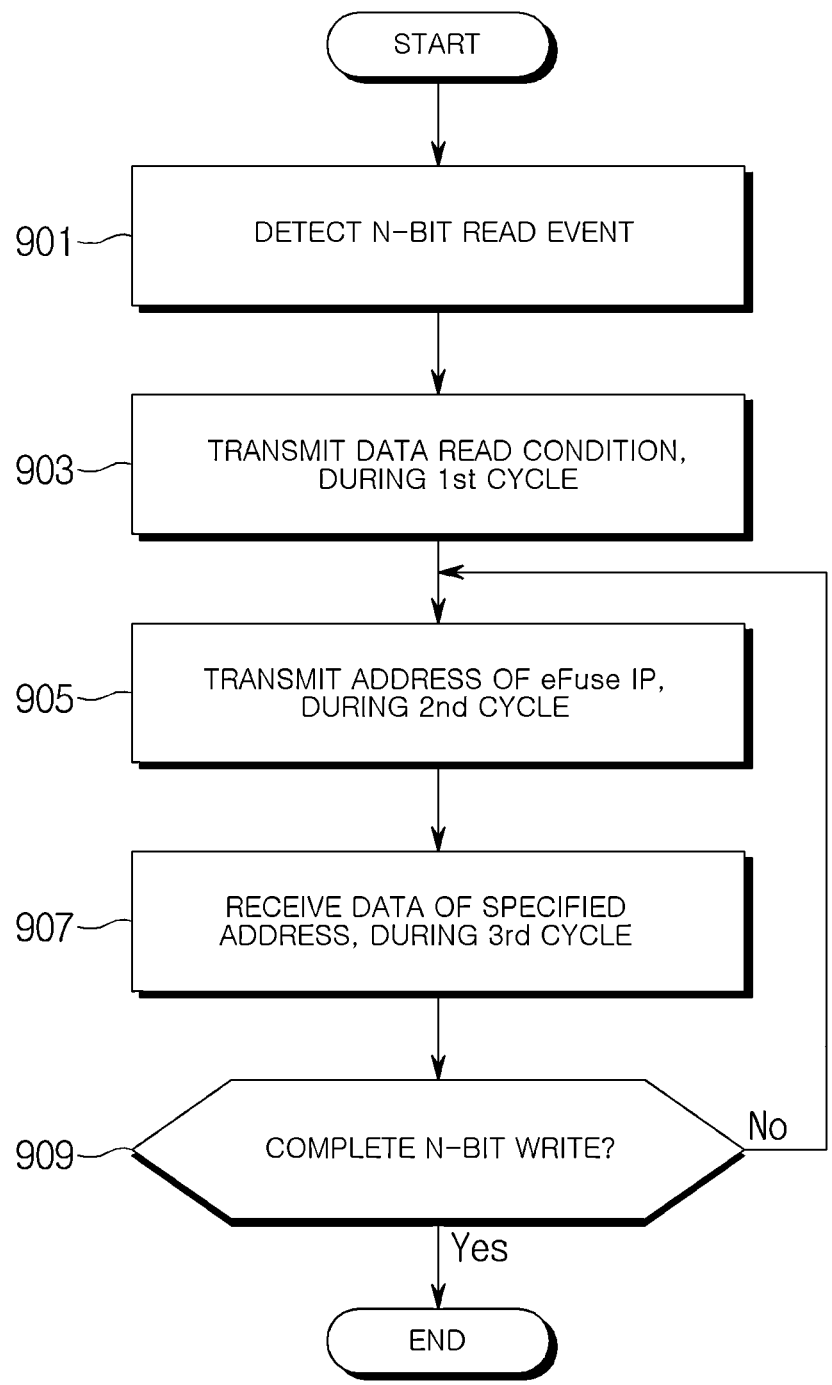
FIG. 9A illustrates a flowchart of the performing of a data read operation to an example eFuse_I2C IP in an example I2C master, in accordance with one or more embodiments.

FIG. 9A is a flowchart illustrating an example of performing an operation to read data to the eFuse_I2C IP in the I2C master, in accordance with one or more embodiments. In an example, the I2C master may be the I2C master 400 of FIG. 7, and the eFuse_I2C IP may be the eFuse_I2C IP 100 of FIG. 7. In the embodiment of FIG. 9A, each operation may be sequentially performed, and is not necessarily sequentially performed. For example, the order of each operation may be changed, and at least two operations may be performed in parallel.

Referring to FIG. 9A, in operation 901, the I2C master 400 may detect an event where n-bit data is read into the eFuse IP 120 of the eFuse_I2C IP 100. The event where n-bit data is read may be detected based on a user's input and/or a specified rule.

In operation 903, the I2C master 400 may transmit the data read condition to the eFuse_I2C IP 100 through the I2C communication during the first cycle. In an example, the I2C master 400 may transmit the address of the slave chip, the R/W bit, the command register address, and the data read condition through the serial data line (SDA) during the first cycle. The address of the slave chip, the R/W bit, the command register address, and/or the data write condition may be configured as described in operation 701 of FIG. 7.

In operation 905, the I2C master 400 may transmit the address of the eFuse IP 120 to the eFuse IP 120 through I2C communication during the second cycle. In an example, the I2C master 400 may transmit the address of the slave chip, the R/W bit, and the register address through the serial data (SDA) line. The address of the slave chip, the R/W bit, and the register address may be configured as described in operation 703 of FIG. 7.

In operation 907, the I2C master 400 may receive data of the address of the eFuse IP 120 through the I2C communication during the third cycle. In an example, the I2C master 400 may transmit the address of the slave chip and the R/W bit through the serial data line (SDA), and may then receive, through the serial data line (SDA), the data recorded in the specified address of the eFuse IP 120. In an example, the R/W bit 822 may be set to 1'b1 which is a value indicating that the read operation is performed in a corresponding cycle.

In operation 909, the I2C master 400 may determine whether the data read operation for n bits has been completed. When the data read operation for n bits is not completed, the I2C master 400 may return to operation 905 to repeatedly perform the second cycle in which the address of the eFuse IP 120 is transmitted and the third cycle in which the address of the eFuse IP 120 is received. In an example, when there is no need to change the data read condition while reading n-bit data to the eFuse IP 120 of the eFuse_I2C IP 100, the I2C master 400 may perform for the first time only once the first cycle in which the data read condition is transmitted, and can omit the subsequent thereto.

Figure 9B:
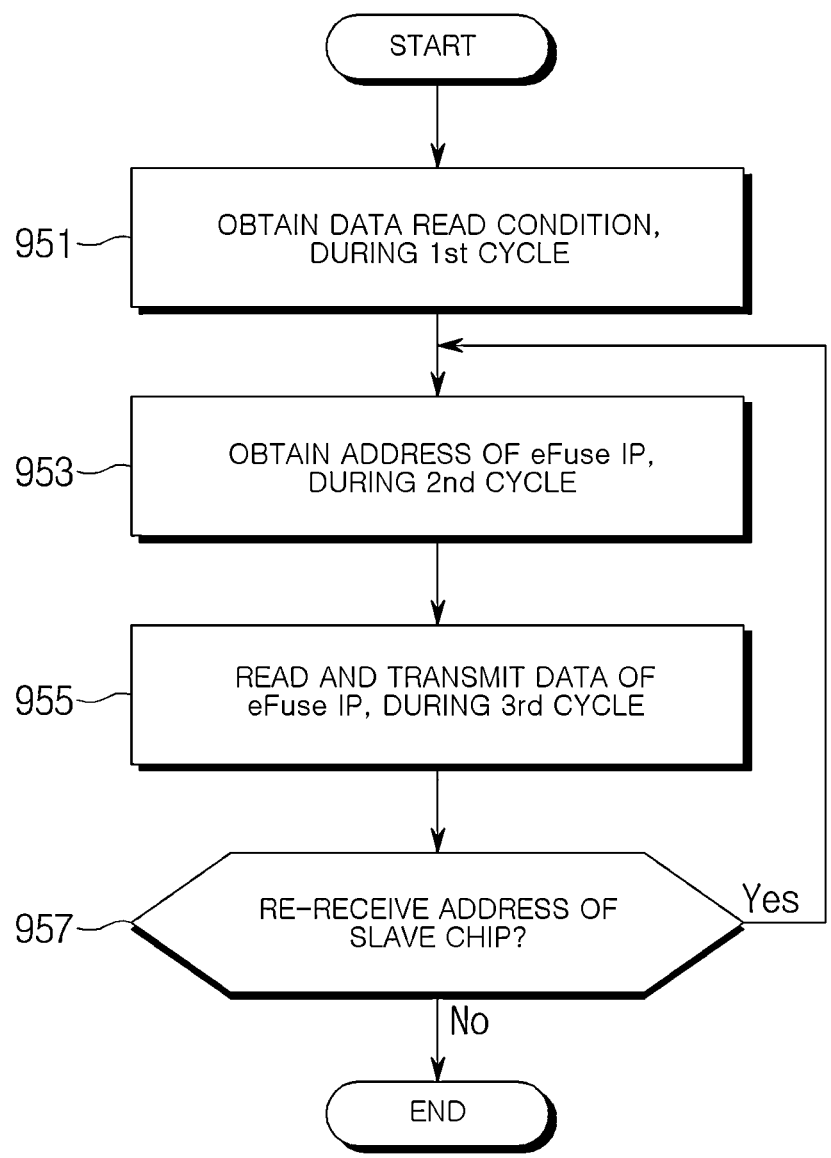
FIG. 9B illustrates a flowchart of the performing of a data read operation in an example eFuse_I2C IP, in accordance with one or more embodiments.

FIG. 9B is a flowchart illustrating an example of performing an operation to read data in the eFuse_I2C IP, in accordance with one or more embodiments. In an example, the I2C master may be the I2C master 400 of FIG. 7, and the eFuse_I2C IP may be the eFuse_I2C IP 100 of FIG. 7. In the embodiment of FIG. 9B, each operation may be sequentially performed, and is not necessarily sequentially performed. In an example, the order of each operation may be changed, and at least two operations may be performed in parallel.

Referring to FIG. 9B, in operation 951, the eFuse_I2C IP 100 may receive the data read condition through the I2C communication during the first cycle. In an example, the eFuse_I2C IP 100 may receive the address of the slave chip, the R/W bit, the command register address, and the data read condition transmitted from the I2C master 400 through the serial data input (SDAI) pin during the first cycle. The eFuse_I2C IP 100 may store and/or set the data read condition in the command register within the register block 220, based on the command register address.

In operation 953, the eFuse_I2C IP 100 may obtain the address of the eFuse IP 120 through the I2C communication during the second cycle. According to the embodiment, the eFuse_I2C IP 100 may receive the address of the slave chip, the R/W bit, and the address of the eFuse IP transmitted from the I2C master 400 through the serial data input (SDAI) pin during the second cycle.

In operation 955, through the I2C communication during the third cycle, the eFuse_I2C IP 100 may read the data of the address of the eFuse IP 120 and transmit the read data to the I2C master 400. The address of the eFuse IP 120 may be the address obtained in operation 953. In an example, the eFuse_I2C IP 100 may receive the address of the slave chip and the R/W bit transmitted from the I2C master 400 through the serial data input (SDAI) pin during the third cycle, and then may read the data recorded (or programmed) in the address of the eFuse IP 120 and transmit to the I2C master 400 through the serial data output (SDAO) pin. The eFuse_I2C IP 100 transmits the data of the address of the eFuse IP 120 to the I2C master 400 and then receives the ack signal of 1'b1 rather than 1'b0 from the master, thereby informing that the data read operation is completed.

After completing the data read operation, the eFuse_I2C IP 100 may determine, in operation 957, whether the address of the slave chip is received again. When the address of the slave chip is received again, the eFuse_I2C IP 100 may return to operation 953 and may perform again the operations subsequent to operation 953. In an example, when the address of the slave chip is received again, the eFuse_I2C IP 100 determines that the data read operation for n bits is not completed, and performs the operations subsequent to operation 953 again in order to perform the data read operation on other bits where the data read operation has not been performed. When the address of the slave chip is not received again, the eFuse_I2C IP 100 may determine that the data read operation for n bits has been completed.

In FIGS. 9A and 9B described above, by assuming that there is no need to change the data read condition while reading n-bit (or multi-bit) data of the eFuse IP 120, a method has been described in which the I2C master 400 and the eFuse_I2C IP 100 perform for the first time only once the operation to set the data read condition. However, when it is necessary to change the data read condition for each of n bits while reading n-bit data of the eFuse IP 120, the I2C master 400 and the eFuse_I2C IP 100 should perform the operation to set the data read condition for each bit.

Figure 10:
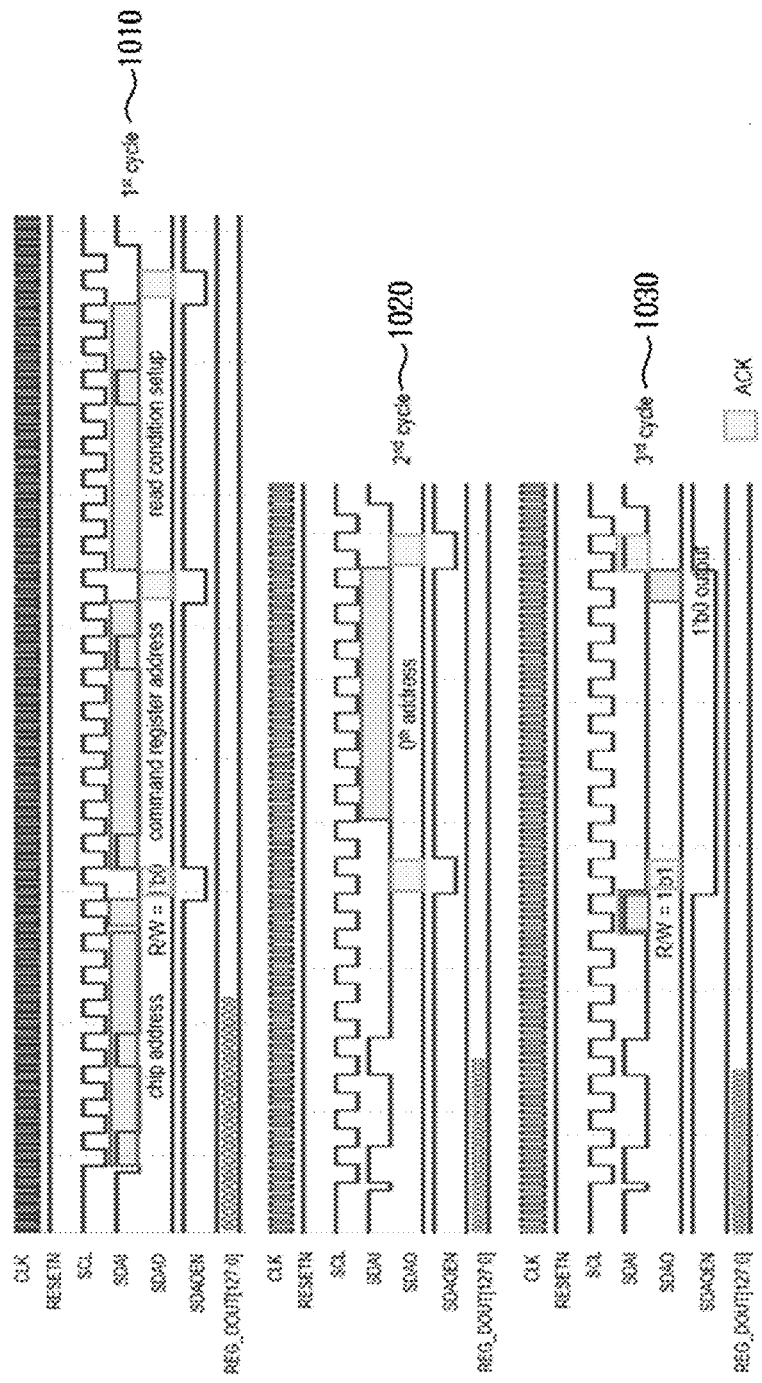
FIGS. 10 to 12 illustrate simulation results of initial read, write, and read operations for 1-bit data in an example eFuse IP which supports I2C communication, in accordance with one or more embodiments.
Figure 11:
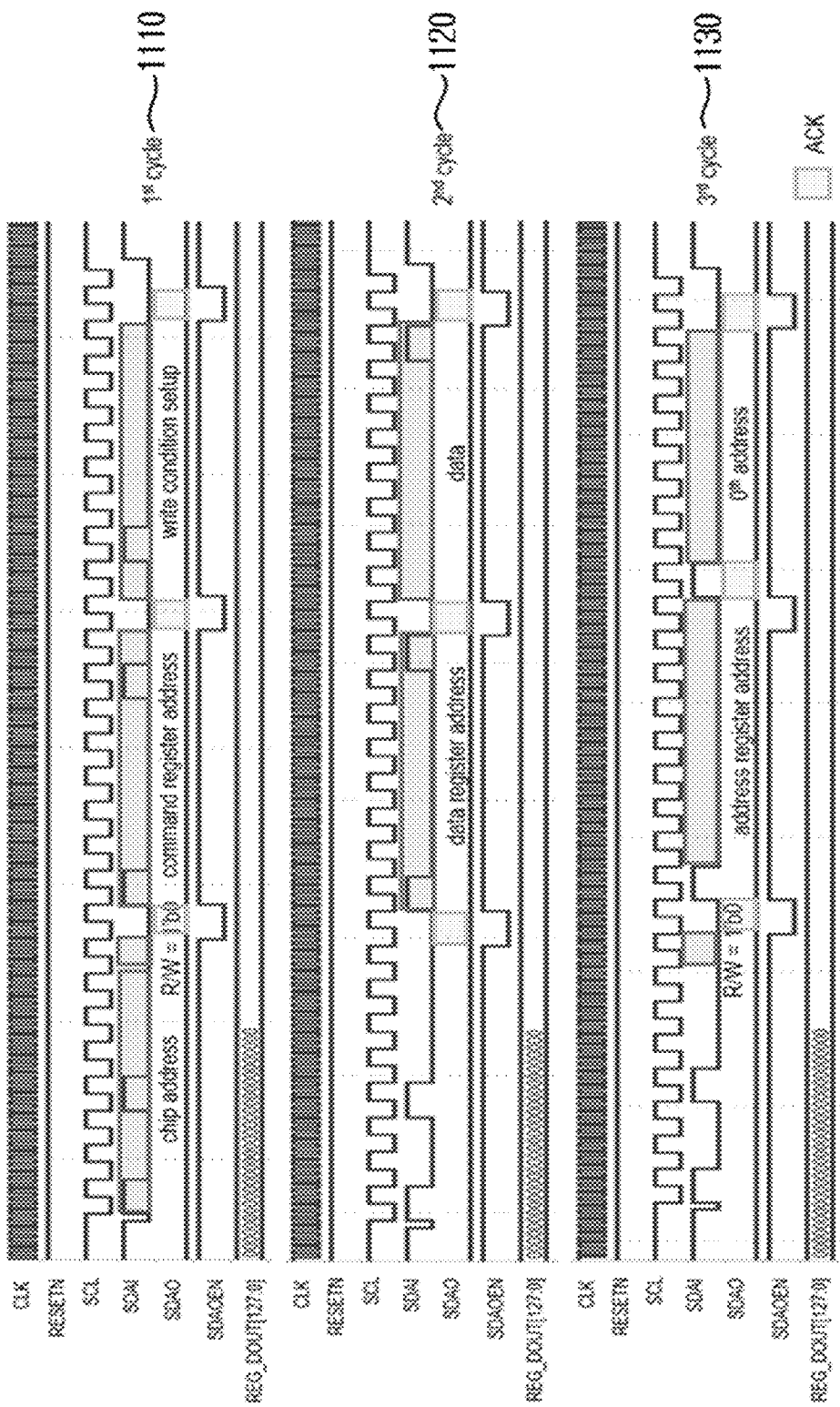
Figure 12:
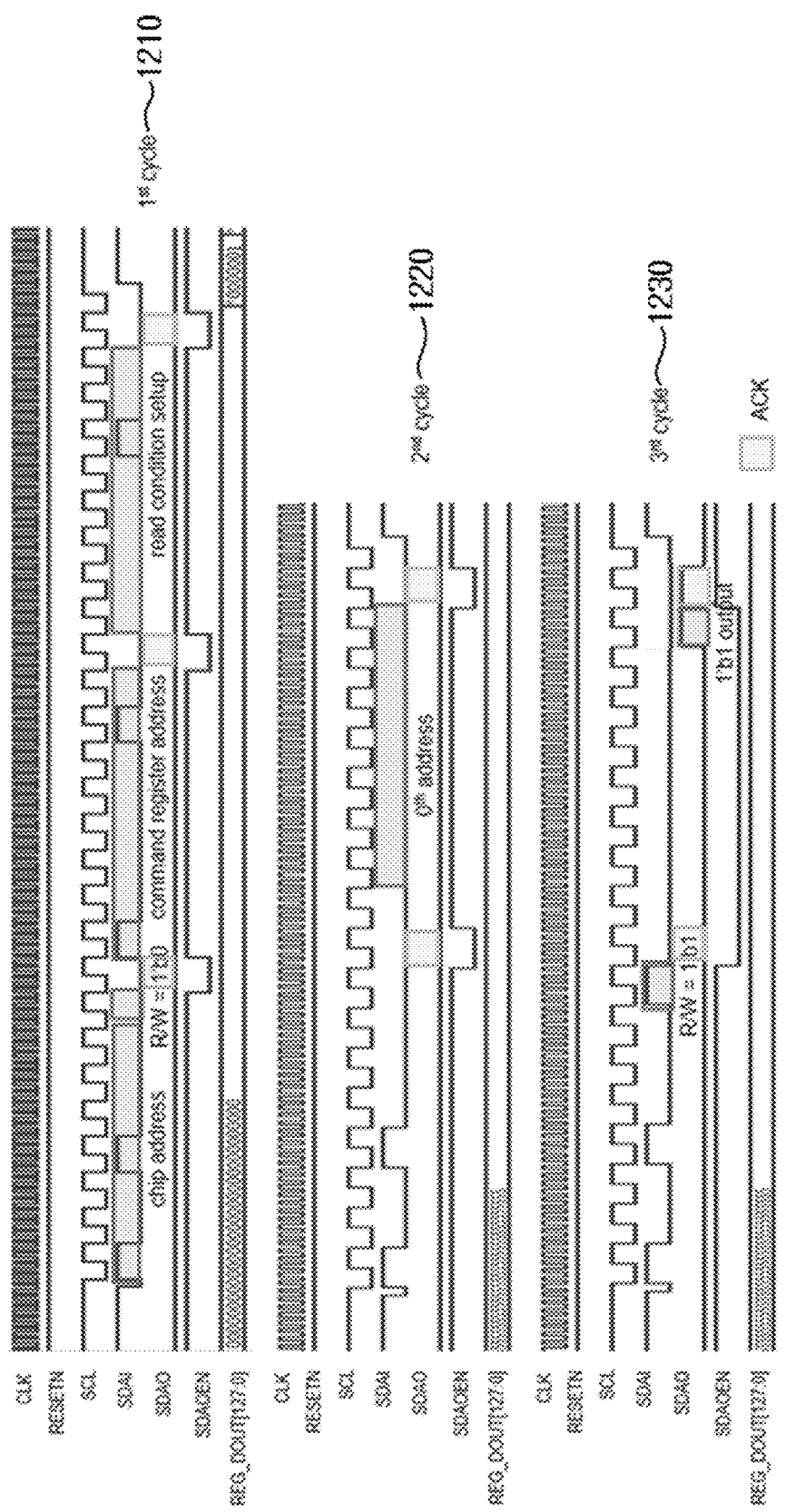

FIGS. 10 to 12 illustrate simulation results of initial read, write, and read operations for 1-bit data in the eFuse IP which supports the I2C communication, in accordance with one or more embodiments. Hereinafter, in the simulations of FIGS. 10 to 12, a serial clock frequency of 400 KHz which supports a fast mode and a clock frequency of 2 MHz used in the eFuse controller are applied. However, the examples are not limited to the clock frequencies, and other clock frequencies may be applied the same. One or more examples may operate normally even when the serial clock frequency is about 700 KHz and the clock frequency used in the eFuse controller is 1 MHz to 4 MHz.

FIG. 10 illustrates a simulation result of an initial read operation of the eFuse_I2C IP 100, in accordance with one or more embodiments.

Referring to FIG. 10, the eFuse_I2C IP 100 may receive the chip address, the R/W bit, the command register address, and data to set the read condition through the serial data input (SDAI) pin during a first cycle 1010, and may set the read condition at a corresponding address of the command register. In the first cycle 1010, the eFuse_I2C IP 100 may transmit an ack signal of 1'b0 through the serial data output (SDAO) pin whenever 8-bit data is received through the serial data input (SDAI) pin.

The eFuse_I2C IP 100 may receive the chip address, the R/W bit, and the address of the eFuse IP 120 through the serial data input (SDAI) pin during a second cycle 1020. In an example, the address of the eFuse IP 120 may be, as illustrated in FIG. 10, set to 0th address. In the second cycle 1020, the eFuse_I2C IP 100 may transmit the ack signal of 1'b0 through the serial data output (SDAO) pin whenever 8-bit data is received through the serial data input (SDAI) pin.

The eFuse_I2C IP 100 may receive the chip address and the R/W bit through the serial data input (SDAI) pin during a third cycle 1030, and may then transmit the data stored in the address of the eFuse IP 120 to the I2C master 400 through the serial data output (SDAO) pin. In the third cycle 1030, the R/W bit may be set to 1'b1 indicating the read operation. The eFuse_I2C IP 100 receives the chip address and the R/W bit, and then transmit the ack signal of 1'b0 through the serial data output (SDAO) pin. The eFuse_I2C IP 100 transmits the data stored in the 0th address that is the specified address of the eFuse IP 120 to the I2C master 400 through the serial data output (SDAO) pin, and receives the ack signal of 1'b1 through the serial data input (SDAI) pin, thereby informing that the initial read operation is completed.

FIG. 11 illustrates a simulation result of the write operation of the eFuse_I2C IP 100, in accordance with one or more embodiments. In an example, the write operation of FIG. 11 may be performed after the initial read operation of FIG. 10 is performed.

Referring to FIG. 11, the eFuse_I2C IP 100 may receive the chip address, the R/W bit, the command register address, and data to set the write condition through the serial data input (SDAI) pin during a first cycle 1110, and may set the write condition at a corresponding address of the command register. In the first cycle 1110, the eFuse_I2C IP 100 may transmit an ack signal of 1'b0 through the serial data output (SDAO) pin whenever 8-bit data is received through the serial data input (SDAI) pin.

The eFuse_I2C IP 100 may receive the chip address, the R/W bit, the data register address, and the data to be programmed in the eFuse IP 120 through the serial data input (SDAI) pin during a second cycle 1120. In the second cycle 1120, the eFuse_I2C IP 100 may transmit the ack signal of 1'b0 through the serial data output (SDAO) pin whenever 8-bit data is received through the serial data input (SDAI) pin.

The eFuse_I2C IP 100 may receive the chip address, the R/W bit, the address register address, and the address of the eFuse IP 120 through the serial data input (SDAI) pin during a third cycle 1130. The address of the eFuse IP 120 may be, as illustrated in FIG. 10, set to 0th address. In the third cycle 1130, the eFuse_I2C IP 100 may transmit the ack signal of 1'b0 through the serial data output (SDAO) pin whenever 8-bit data is received through the serial data input (SDAI) pin.

Under the write condition set in the first cycle 1110, the eFuse_I2C IP 100 may record the data obtained during the second cycle 1120 in the address of the eFuse IP 120 obtained in the third cycle 1130, for example, 0th address.

FIG. 12 illustrates a simulation result of the read operation of the eFuse_I2C IP 100, in accordance with one or more embodiments. In an example, the read operation of FIG. 12 may be performed after the write operation of FIG. 11 is performed.

Referring to FIG. 12, the eFuse_I2C IP 100 may receive the chip address, the R/W bit, the command register address, and data to set the read condition through the serial data input (SDAI) pin during a first cycle 1210, and may set the read condition at a corresponding address of the command register. In the first cycle 1210, the eFuse_I2C IP 100 may transmit an ack signal of 1'b0 through the serial data output (SDAO) pin whenever 8-bit data is received through the serial data input (SDAI) pin.

The eFuse_I2C IP 100 may receive the chip address, the R/W bit, and the address of the eFuse IP 120 through the serial data input (SDAI) pin during a second cycle 1220. In an example, the address of the eFuse IP 120 may be, as illustrated in FIGS. 10 and 11, set to 0th address. In the second cycle 1220, the eFuse_I2C IP 100 may transmit the ack signal of 1'b0 through the serial data output (SDAO) pin whenever 8-bit data is received through the serial data input (SDAI) pin.

The eFuse_I2C IP 100 may receive the chip address and the R/W bit through the serial data input (SDAI) pin during a third cycle 1230, and may then transmit the data stored in the address (e.g., 0th address) of the eFuse IP 120 to the I2C master 400 through the serial data output (SDAO) pin. In the third cycle 1230, the R/W bit may be set to 1'b1 indicating the read operation. The eFuse_I2C IP 100 may receive the chip address and the R/W bit, and then transmit the ack signal of 1'b0 through the serial data output (SDAO) pin. The eFuse_I2C IP 100 may transmit the data stored in the 0th address to the I2C master 400 through the serial data output (SDAO) pin, and receives the ack signal of 1'b1 through the serial data input (SDAI) pin, thereby informing that the read operation is completed.

In FIGS. 4 to 12 described above, the operation of the eFuse_I2C IP 100 may be performed by the I2C slave 110 included in the eFuse_I2C IP 100.

In the one or more examples, the eFuse_I2C IP 100 may write or read data to or from the eFuse IP 120 as described above. Additionally, the eFuse_I2C IP 100 may provide data obtained by the data read operation from the eFuse IP 120 as an input signal (or control signal) of at least one component (e.g., the analog block 310 in FIG. 3, the customer/foundry IP 330) of the customer designed circuit.

The eFuse_I2C IP 100, I2C slave 110, eFuse IP 120, as well as the remaining apparatuses, units, modules, devices, and other components, described herein may be implemented by hardware components and software components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

Therefore, the scope of the disclosure is defined not by the detailed description, but by the claims and their equivalents, and all variations within the scope of the claims and their equivalents are to be construed as being included in the disclosure.

What is claimed is:

1. An eFuse one-time programmable (OTP) memory, comprising:
    an eFuse configured to perform one-time writing and multiple readings for a plurality of addresses;
    an inter integrated circuit (I2C) slave, configured to communicate with an I2C master via a serial clock line and a serial data line, and perform data writing and data reading to and from the eFuse, wherein the I2C slave includes:
        an I2C slave interface, configured to communicate with the I2C master, a register block, configured to store serial data received from the I2C master through the serial data line, and store data read from the eFuse IP, an efuse controller, configured generate a control signal to write data to the eFuse IP or to read data stored in the eFuse IP, based on the serial received through the serial data line, and a clock control, configured to provide a clock signal to control operations of the efuse controller;

a serial data input pin which is connected to the serial data line through an open drain input/output device, and is configured to receive the serial data from the I2C master;

a serial data output pin which is connected to the serial data line through the open drain input/output device, and is configured to output data to the I2C master; and a serial data output enable pin which is configured to output a signal controlling the open drain input/output such that the serial data input pin or the serial data output pin is connected to the serial data line.

2. The eFuse OTP memory of claim 1, wherein the I2C slave is configured to:

receive a data write condition through the serial data line in a first cycle, receive first data to be programmed in the eFuse through the serial data line in a second cycle, receive an address of the eFuse to program the first data through the serial data line in a third cycle, and write the first data to the address of the eFuse, based on the received data write condition.

3. The eFuse OTP memory of claim 2, wherein the data write condition comprises at least one of a fusing current value to be used while writing the first data to the address of the eFuse, whether to select a read mode, or whether to check a margin of a resistance value of an initial eFuse.

4. The eFuse OTP memory of claim 2, wherein the I2C slave is further configured to:

receive a chip address, an R/W bit, a command register address, and the data write condition through the serial data line in the first cycle, and store the data write condition in the command register address of the register block, receive the chip address, the R/W bit, a data register address, and the first data to be programmed in the eFuse through the serial data line in the second cycle, and store the first data in the data register address of the register block, receive the chip address, the R/W bit, an address register address, and the address of the eFuse through the serial data line in the third cycle, and store the address of the eFuse in the address register address of the register block, and transmit a first ack signal through the serial data line, every predetermined period in each cycle, and wherein the R/W bit is set such that a write operation is performed in the first cycle, the second cycle, and the third cycle.

5. The eFuse OTP memory of claim 1, wherein the I2C slave is configured to:

receive a data read condition through the serial data line in a first cycle, receive an address of the eFuse through the serial data line in a second cycle, and transmit second data read from the eFuse based on the address of the eFuse to the I2C master through the serial data line in a third cycle.

6. The eFuse OTP memory of claim 5, wherein the data read condition comprises at least one of whether to select a read mode, or whether to check a margin of a resistance value of an initial eFuse.

7. The eFuse OTP memory of claim 5, wherein the I2C slave is further configured to:

receive a chip address, an R/W bit, a command register address, and the data read condition through the serial data line in the first cycle, and store the data read condition in the command register address of the register block, receive the chip address, the R/W bit, and the address of the eFuse through the serial data line in the second cycle, receive the chip address and the R/W bit through the serial data line in the third cycle, and transmit, through the serial data line, the second data read from the eFuse based on the address of the eFuse to the I2C master, and transmit a first ack signal through the serial data line, every predetermined period in each cycle.

8. The eFuse OTP memory of claim 7, wherein the R/W bit indicates which of a write operation and a read operation is performed in a corresponding cycle, and is set to indicate that the write operation is performed in the first cycle and in the second cycle and to indicate that the read operation is performed in the third cycle.

9. The eFuse OTP memory of claim 7, wherein the I2C slave is further configured to transmit, through the serial data line in the third cycle, the second data read from the eFuse based on the address of the eFuse to the I2C master, and receive a second ack signal indicating that the read operation is completed.

* * * * *